(12) United States Patent
Law et al.

(10) Patent No.: US 9,048,375 B2
(45) Date of Patent: Jun. 2, 2015

(54) IRON PYRITE THIN FILMS FROM MOLECULAR INKS

(71) Applicant: THE REGENTS OF THE UNIVERSITY OF CALIFORNIA, Oakland, CA (US)

(72) Inventors: Matthew Law, Irvine, CA (US); Amanda S. Weber, Irvine, CA (US); Sean Seefeld, Irvine, CA (US); James Puthussery, Tustin, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 13/799,448

(22) Filed: Mar. 13, 2013

(65) Prior Publication Data

US 2014/0205756 A1  Jul. 24, 2014

Related U.S. Application Data

(60) Provisional application No. 61/754,461, filed on Jan. 18, 2013.

(51) Int. Cl.
| | |
|---|---|
| *B05D 1/02* | (2006.01) |
| *B05D 3/02* | (2006.01) |
| *H01L 31/18* | (2006.01) |
| *B05D 3/04* | (2006.01) |
| *B05D 1/00* | (2006.01) |

(52) U.S. Cl.
CPC .......... *H01L 31/1864* (2013.01); *B05D 3/0453* (2013.01); *B05D 1/005* (2013.01); *B05D 3/0254* (2013.01); *B05D 1/02* (2013.01)

(58) Field of Classification Search
CPC ........ B05D 1/005; B05D 1/02; B05D 3/0254; B05D 3/0453; H01L 31/1864
USPC .................... 427/240, 372.2, 374.1, 377, 427
See application file for complete search history.

(56) References Cited

U.S. PATENT DOCUMENTS

| | | | | |
|---|---|---|---|---|
| 2011/0240108 | A1* | 10/2011 | Law et al. ...................... | 136/255 |
| 2011/0305626 | A1* | 12/2011 | Wadia et al. ................ | 423/561.1 |
| 2013/0119346 | A1* | 5/2013 | Huang et al. .................... | 257/21 |

OTHER PUBLICATIONS

Nakamura et al., "Electrodeposition of pyrite(FeS2) thin films for photovoltaic cells", 2001, Solar Energy Materials & Solar Cells, 65, p. 79-85.*

Dong et al., "Formation of pyrite (FeS2) thin nano-films by thermal-sulfurating electrodeposition films at different temperature", 2005, Matterials Letters, 59, p. 2398-2402.*

* cited by examiner

*Primary Examiner* — Kirsten Jolley
(74) *Attorney, Agent, or Firm* — One LLP

(57) ABSTRACT

Systems and methods are provided for fabricating pyrite thin films from molecular inks. A process is provided that comprises dissolving simple iron-bearing and sulfur-bearing molecules in an appropriate solvent and then depositing the solution onto an appropriate substrate using one of several methods (roll-to-roll coating, spraying, spin coating, etc.), resulting in a solid film consisting of the molecules. These molecular precursor films are then heated to 200-600° C. in the presence of sulfur-bearing gases (e.g., $S_2$, $H_2S$) to convert the molecular films into films of crystalline iron pyrite ($FeS_2$).

19 Claims, 21 Drawing Sheets

IRON PYRITE THIN FILMS FROM MOLECULAR INKS

The present application claims the benefit of and priority to U.S. Provisional Application No. 61/754,461 titled "IRON PYRITE THIN FILMS FROM MOLECULAR INKS," filed on Jan. 18, 2013, which is hereby incorporated by reference in its entirety.

STATEMENT REGARDING FEDERALLY SPONSORED RESEARCH OR DEVELOPMENT

This invention was made with Government support under Grant No. CHE-1035218, awarded by the National Science Foundation. The Government has certain rights in this invention.

FIELD

The embodiments relate generally to solar cells and iron pyrite thin film solar cell devices, and more particularly to methods for generating iron pyrite thin films from molecular inks.

BACKGROUND

The current annual global energy demand of ~14 terawatt-years (TW-yrs) is expected to double by mid-century and triple by the end of the century. Such a large increase in energy demand cannot be met by the existing carbon-based technologies without further destabilizing the climate. The sun is the largest source of carbon-free energy (120,000 TW-yrs strike the earth's surface annually) and can be used to produce both electricity and fuel. Yet in the United States, solar electricity (e.g. photovoltaics) and solar-derived fuels (e.g. biomass) currently provide about 1 millionth of the total electricity supply and less than 0.1% of total energy consumption, respectively.

An area of great promise for low-cost solar energy conversion is inorganic thin-film photovoltaics (PV). Thin-film PV has the potential to revolutionize the photovoltaics industry via cheaper processing and eliminating the use of expensive silicon wafers that account for over 50% of total manufacturing cost of traditional silicon-based PV. Current thin-film technology is based on amorphous silicon, CdTe, and CIGS (copper indium gallium diselenide) as the active absorber layers. These materials can be made 50-100 times thinner than traditional silicon cells because of their larger optical absorption coefficients. The resulting lower cost per peak watt ($/Wp) is driving the extraordinary market growth of thin-film PV, which is projected to account for 28% of the solar market by 2012 (at $19.7 billion in sales). CdTe and CIGS are currently the most favored of the thin-film technologies due to their high laboratory cell efficiencies (16.5% for CdTe and 19.9% for CIGS) and because amorphous silicon encounters certain stability problems. However, the future market share and societal impact of CdTe and CIGS PV will be limited by the scarcity of tellurium (Te) and indium (I) in the Earth's crust. Most projections conclude that price constraints on tellurium and indium will limit CdTe and CIGS to 0.3 TWs or less of total solar conversion capacity, which falls far short of the tens of terawatts of carbon-free energy that are needed to meet the global energy challenge. To enable the rapid expansion of PV to the multi-TW scale, it is essential to develop alternative thin-film PV materials based on common (rock-forming) elements and inexpensive manufacturing processes.

Iron pyrite (cubic $FeS_2$) is experiencing renewed interest as an earth-abundant, nontoxic absorber layer for scalable thin-film photovoltaics (PV). Pyrite has an appropriate band gap ($E_g$=0.95 eV), very strong light absorption ($\alpha$>105 cm for h$\nu$>1.3-1.4 eV), and sufficiently long carrier drift and diffusion lengths to produce large short-circuit photocurrent densities (>30 mA cm-2) in photoelectrochemical and solid state Schottky solar cells based on pyrite single crystals. The main limitation with pyrite is the low open-circuit voltage ($V_{oc}$) of pyrite devices, which does not normally exceed 200 mV, or ~20% of the band gap. Efforts to correct this low $V_{oc}$ require basic studies of high-quality bulk and thin film pyrite samples.

Pyrite thin films have been fabricated by a variety of solution-phase and gas-phase methods. Solution methods that leverage atmospheric-pressure, high-throughput, large-area processing techniques like printing, roll coating, slit casting, or spraying may offer cost and scalability advantages relative to the vacuum-based batch processing traditionally employed in PV manufacturing. Solution methods used to make pyrite thin films include spray pyrolysis, chemical bath deposition (CBD), electrophoretic deposition (EPD), and sol gel chemistry. The strategy adopted in most of these cases is to deposit a film of (often amorphous) iron oxides or iron sulfides and anneal the film in sulfur gas at elevated temperatures (350-600° C.) to produce polycrystalline pyrite.

Table 1 compiles the principal reports of solution-deposited pyrite films, listing only those examples that provide substantive optical or electrical characterization of nominally phase-pure samples. Although many of these reports are partial and some present electrical data that is difficult to reconcile with results from other films and pyrite single crystals, most conclude that unintentionally-doped, solution-deposited pyrite films are p-type with low resistivity and low mobility, in agreement with results from samples grown by gas-phase methods. Recently, pyrite films have also been made by the solution deposition of pyrite nanocrystals, either with or without post-deposition sintering to increase grain size and film density, but the electrical properties of these films have not been reported in detail (see Table 1).

TABLE 1

Synthesis and Properties of Solution-Deposited Pyrite Thin Films

| Method | Precursors | Conditions | Reported Properties | Ref |
|---|---|---|---|---|
| spray pyro | aq. $FeCl_3$, thiourea | 550° C. in air (?), no anneal (?) | $E_g$ = 1.05 eV | 6 |
| spray pyro | aq. $FeCl_3$, thiourea | 350° C. in $N_2$ + S, no anneal | $E_g$ = 0.82 eV, p-type,[a] low mobility, $\rho$ = 0.16 $\Omega$ cm | 7 |
| spray pyro | aq. $FeSO_4$, $(NH_4)_2S$ | 120° C. in air, 500° C. anneal in S | p-type,[b] p = $10^{16}$-$10^{28}$ $cm^3$, $\mu$ = 1-200 $cm^2$ $V^{-1}$ $s^{-1}$ (?) | 9 |
| spray pyro | aq. $FeCl_3$ | 350° C. in air, 450° C. anneal in S | $E_g$ = 0.73 eV, $\rho$ = 0.6 $\Omega$ cm, non-Anthenius T dependence | 10 |

TABLE 1-continued

Synthesis and Properties of Solution-Deposited Pyrite Thin Films

| Method | Precursors | Conditions | Reported Properties | Ref |
|---|---|---|---|---|
| spray pyro | aq. FeCl$_3$ | 350° C. in air, 350° C. anneal in S | $E_g$ = 0.93 eV, p-type[a] | 8 |
| electrodep | aq. Na$_2$S$_2$O$_3$, (NH$_4$)$_3$Fe(SO$_4$)$_3$ | 60° C., 500° C. anneal in S | n-type (due to Ti doping?)[a] | 13 |
| electrodep | aq. FeCl$_3$, Na$_2$S$_2$O$_3$ | 25° C., 500° C. anneal in S | $E_g$ = 1.34 eV, p-type,[b] $\rho$ = 10$^{14}$ cm$^{-3}$, $\mu$ = 200 (?) | 12 |
| CBD | Fe(CO)$_3$, S in org. solv. | 800-165° C. in argon, no anneal | photoactive | 17 |
| CBD | aq. FeSO$_4$, on, Na$_2$S$_2$O$_3$ | 28° C., 450° C. anneal in S | $E_g$ = 0.94 eV, n-type (?) | 18 |
| EPD | aq. FeCl$_3$, thiourea | 200° C. no anneal | $E_g$ = 1.19-1.40 eV, n-type (?) | 19 |
| sol gel | aq. Fe(NO$_3$)$_3$ | 25° C., 500° C. anneal in air + 400° C. in S | $E_g$ = 0.99 eV, p-type,[b] $\rho$ = 10$^{19}$ cm$^{-3}$, $\mu$ = 1.5 | 20 |
| sol gel | Fe(NO$_3$)$_3$, PO in EtOH | 25° C., 500° C. anneal in air + 450° C. in S | $E_g$ = 0.93 eV | 22 |
| sol gel | Fe(NO$_3$)$_3$, acac in EG | 40° C., 500° C. anneal in air + 400-600° C. in S | $E_g$ = 0.77-0.87 eV, n-type w/ low T anneal, p-type w/ high T anneal[b] | 21 |
| NC | FeCl$_3$, TOPO, oleylamine | 220° C. in argon, dip coating | $E_g$ = 0.93 eV, p-type,[b] $\rho$ = 80 cm$^2$ V$^{-1}$ s$^{-1}$ (?) | 25 |
| molecular ink | Fe(acac)$_3$ + S in pyridine | 25° C., 320° C. anneal in air, 390° C. in H$_2$S + 550° C. in S | $E_g$ = 0.87 eV, p-type,[a] low mobility, $\rho$ = 1.9 $\Omega$ cm | this work | spray pyro = spray pyrolysis;
electrodep = electrodeposition;
CBD = chemical bath deposition;
EPD = electrophonetic deposition;
NC = nanocrystal deposition.
DEG = diethylene glycol;
en = ethylenediamine;
PO = propylene oxide;
EG = ethylene glycol;
acac = acetylacetone;
TOPO = trioctylphosphine oxide.
(?) = incomplete or questionable data or conclusions.
[a] = by thermopower,
[b] = by Hall effect.

Therefore, high-quality bulk and thin film pyrite and processes to generate the same are desirable.

SUMMARY

A process is provided that comprises dissolving simple iron-bearing and sulfur-bearing molecules in an appropriate solvent and then depositing the solution onto an appropriate substrate using one of several methods (roll-to-roll coating, spraying, spin coating, etc.), resulting in a solid film consisting of the molecules. These molecular precursor films are then heated to 200-600° C. in the presence of sulfur-bearing gases (e.g., S$_2$, H$_2$S) to convert the molecular films into films of crystalline iron pyrite (FeS$_2$).

The systems, methods, features and advantages of the invention will be or will become apparent to one with skill in the art upon examination of the following figures and detailed description. It is intended that all such additional methods, features and advantages be included within this description, be within the scope of the invention, and be protected by the accompanying claims. It is also intended that the invention is not limited to require the details of the example embodiments.

BRIEF DESCRIPTION

The accompanying drawings, which are included as part of the present specification, illustrate the presently preferred embodiment and, together with the general description given above and the detailed description of the preferred embodiment given below, serve to explain and teach the principles of the present invention.

Figure 4:
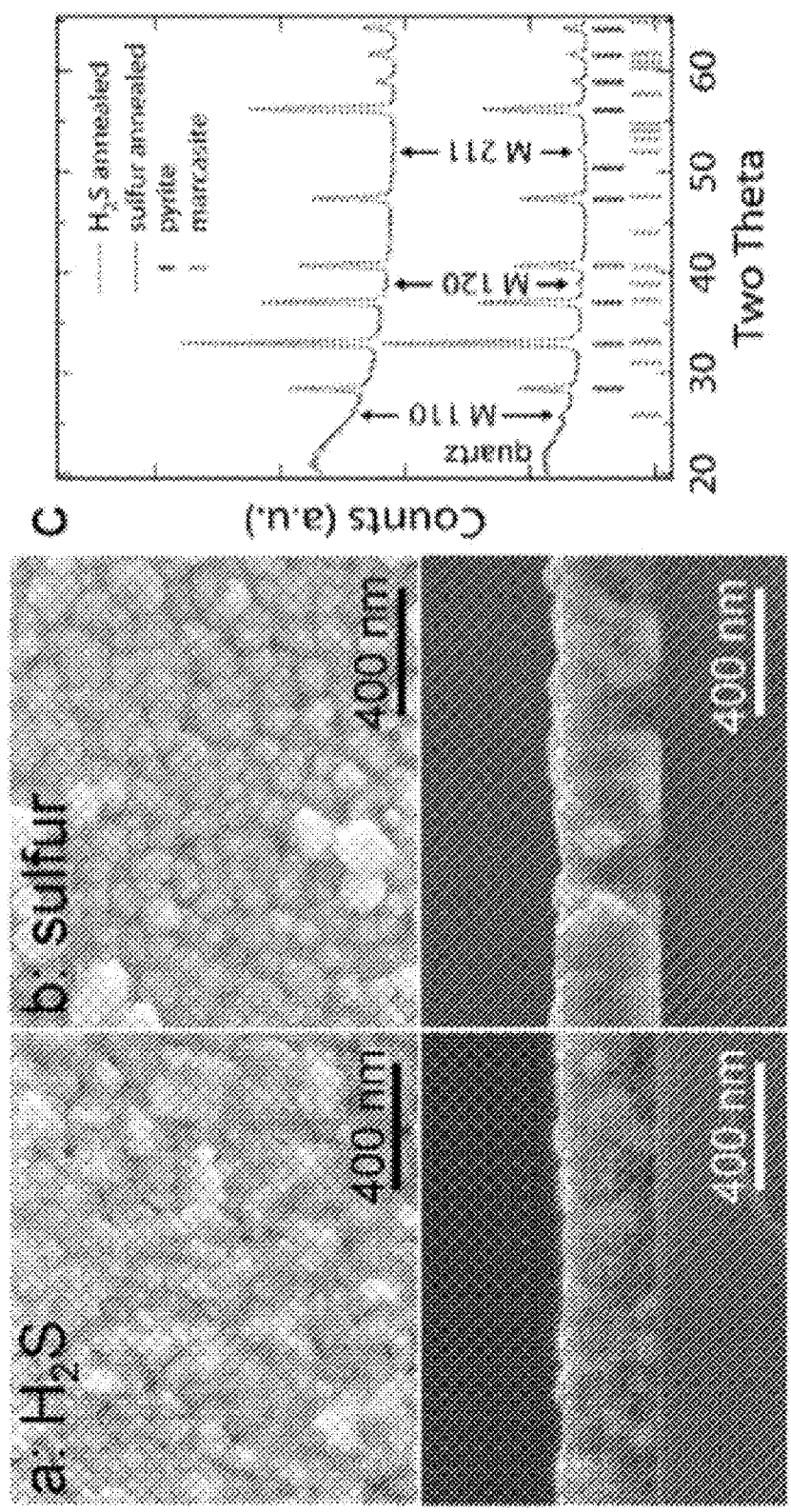

FIGS. 4A-C illustrate SEM and XRD data for a 270±30 nm thick film on quartz before and after sulfur annealing.

Figure 5:
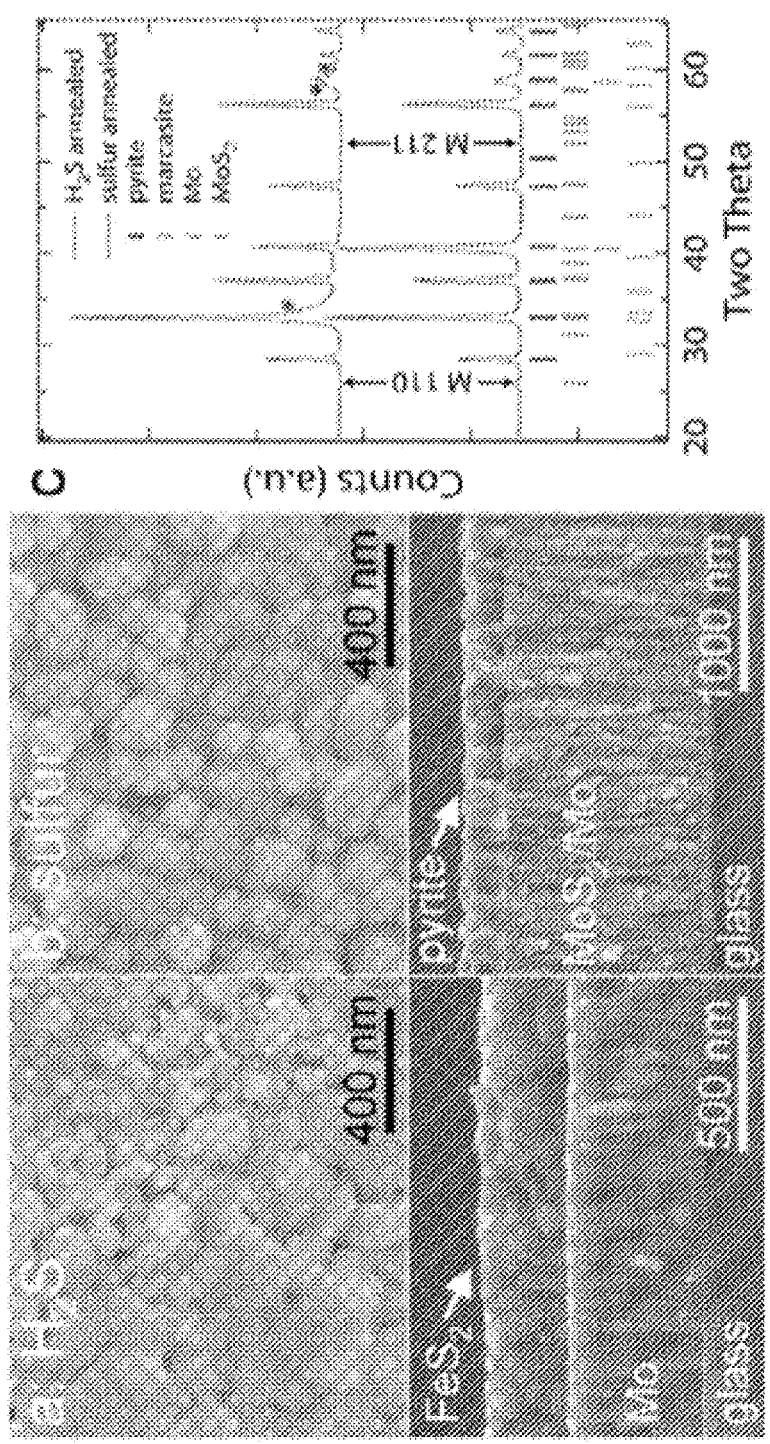

FIGS. 5A-C illustrate SEM and XRD data for a typical 270±30 nm thick FeS$_2$ film on a Mo-coated glass substrate.

Figure 6:
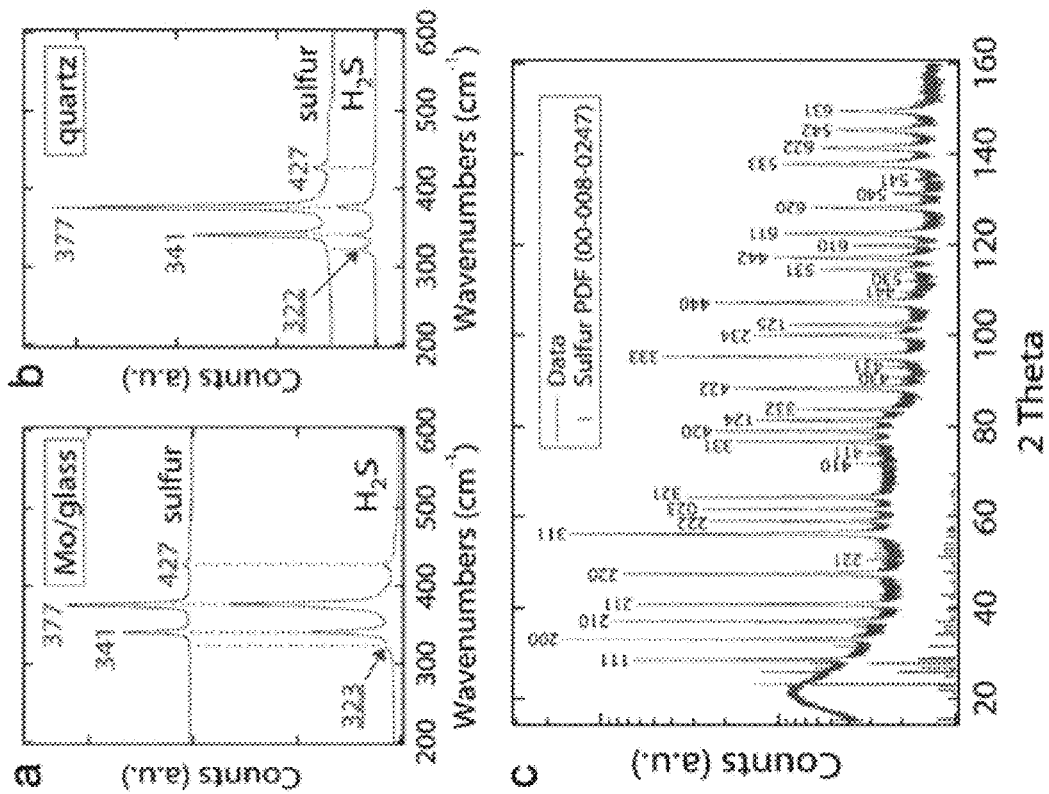

FIGS. 6A-C illustrate Raman spectra of FeS$_2$ films.

Figure 7:
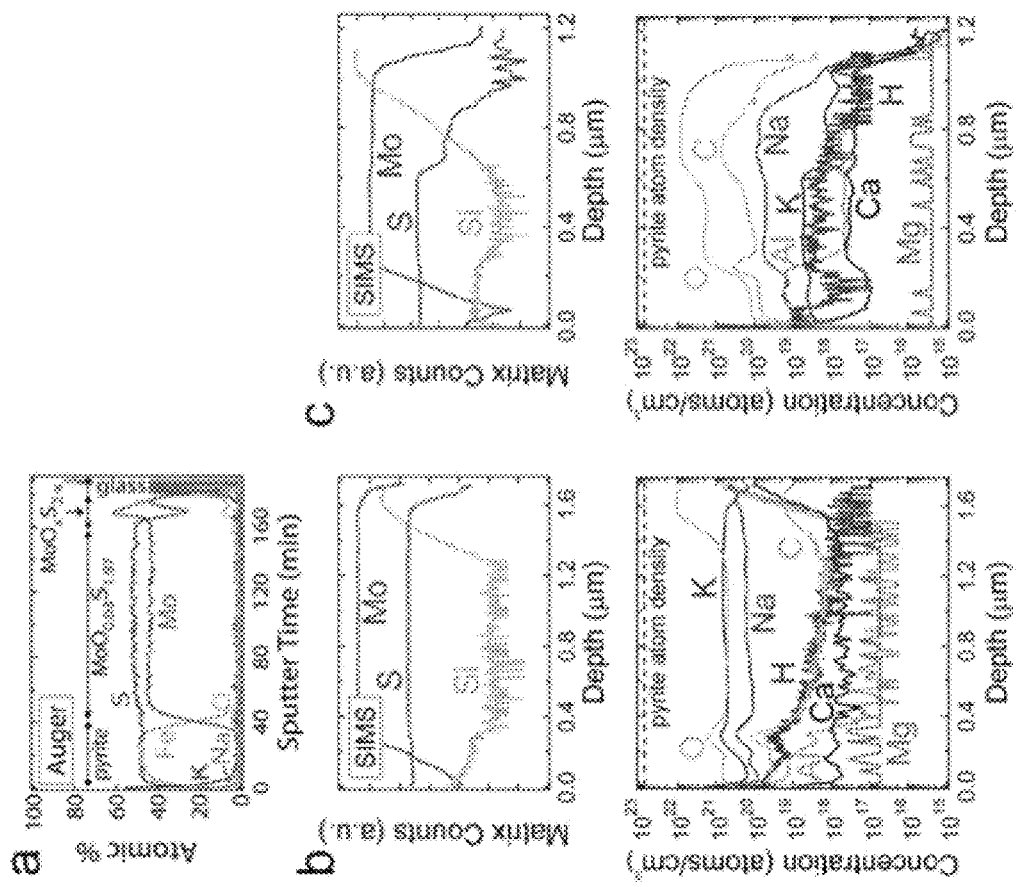

FIGS. 7A-B illustrate AES and SIMS data for a 300±30 nm thick pyrite film on Mo-coated glass. FIG. 7C illustrates SIMS data for a 300±30 nm thick pyrite film on a Mo-coated silicon substrate.

Figure 8:
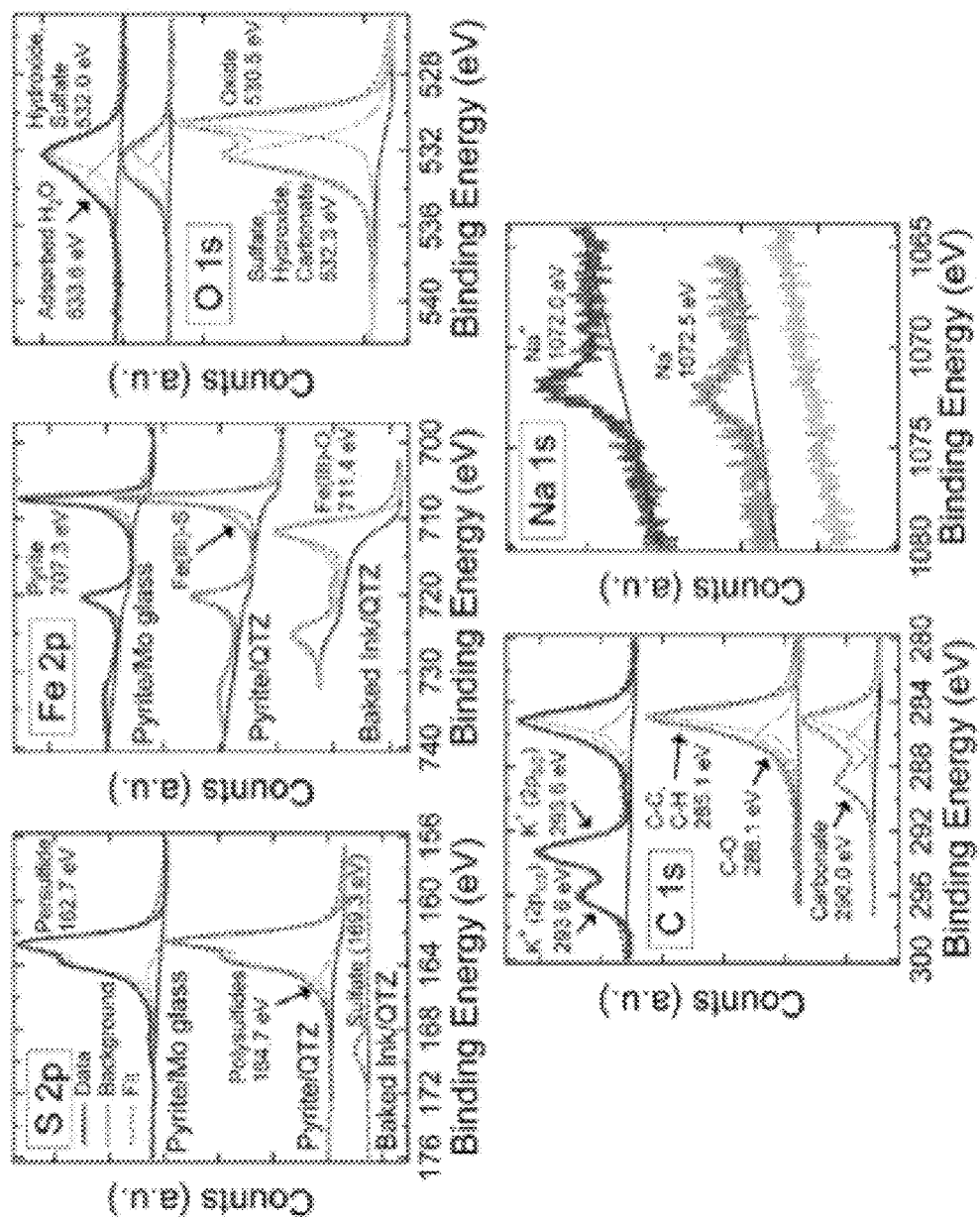

FIG. 8 illustrates exemplary surface composition by XPS.

Figure 9:
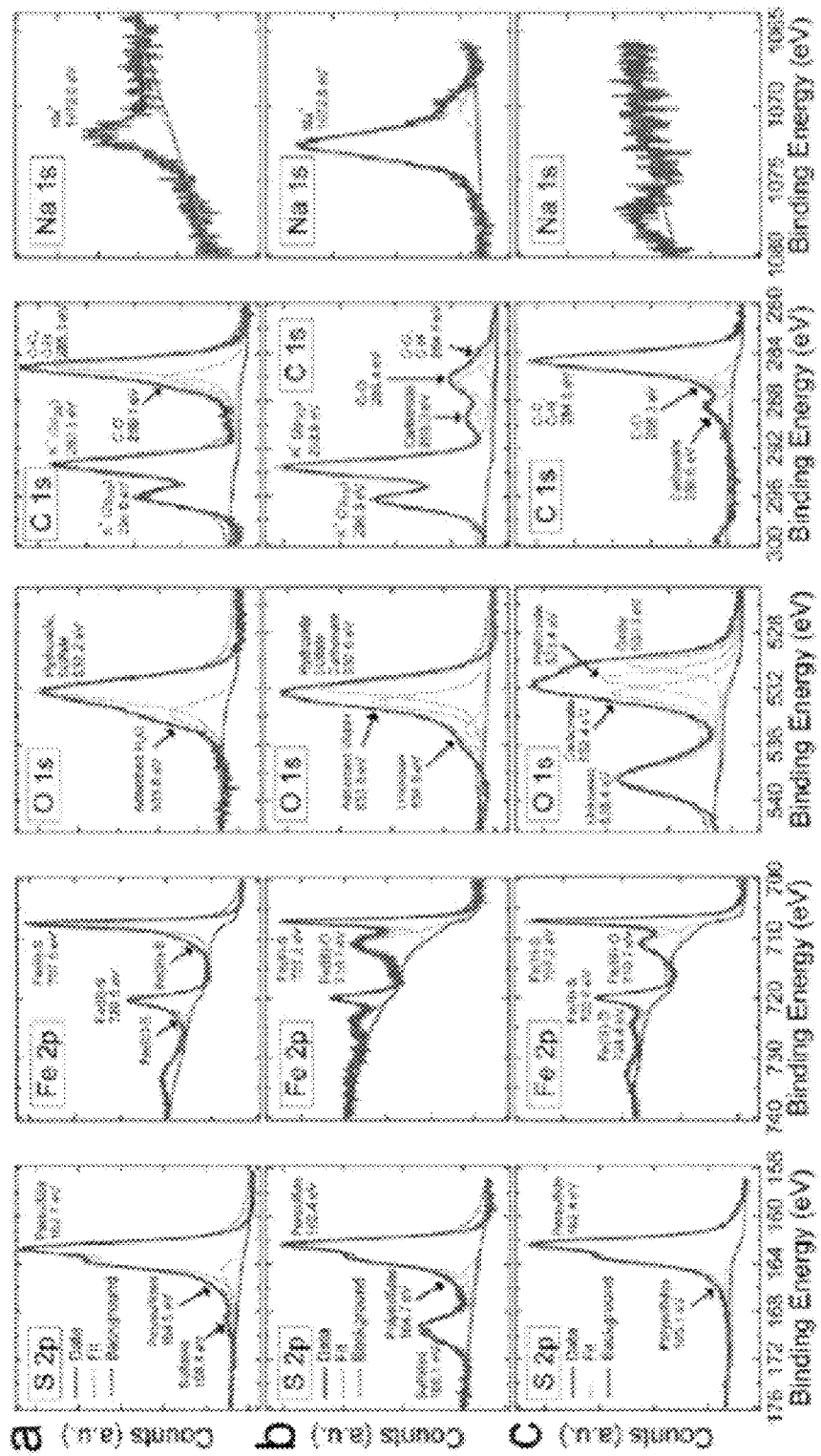

FIGS. 9A-C illustrate XP spectra of a sulfur-annealed pyrite film on a Mo-coated glass substrate freshly prepared, exposed to air for 10 hours, and then rinsed and deionized in water for 10 seconds.

Figure 10:
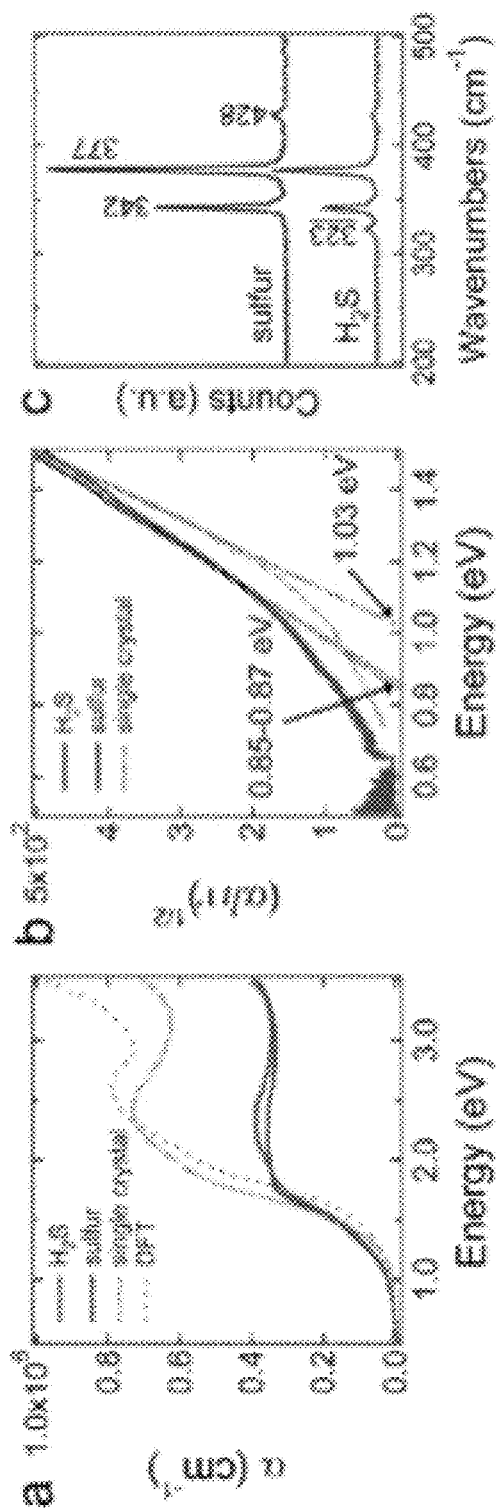

FIGS. 10A-C illustrate optical properties of exemplary pyrite films.

FIGS. 11A-D illustrate exemplary marcasite optical properties.

Figure 12:
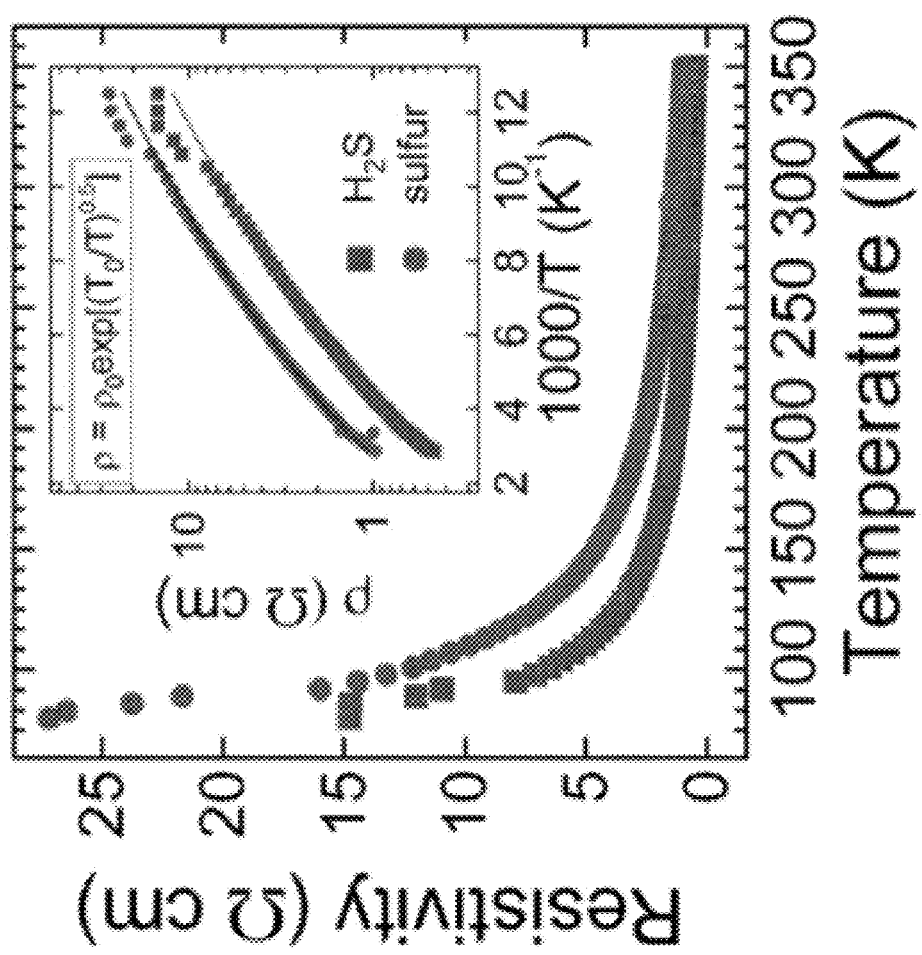

FIG. 12 illustrates exemplary electrical resistivity of pyrite and mixed-phase $FeS_2$ films.

FIGS. 13A-B illustrate UV-Vis spectra of exemplary $Fe(acac)_3$ ink and films, according to one embodiment.

Figure 14:
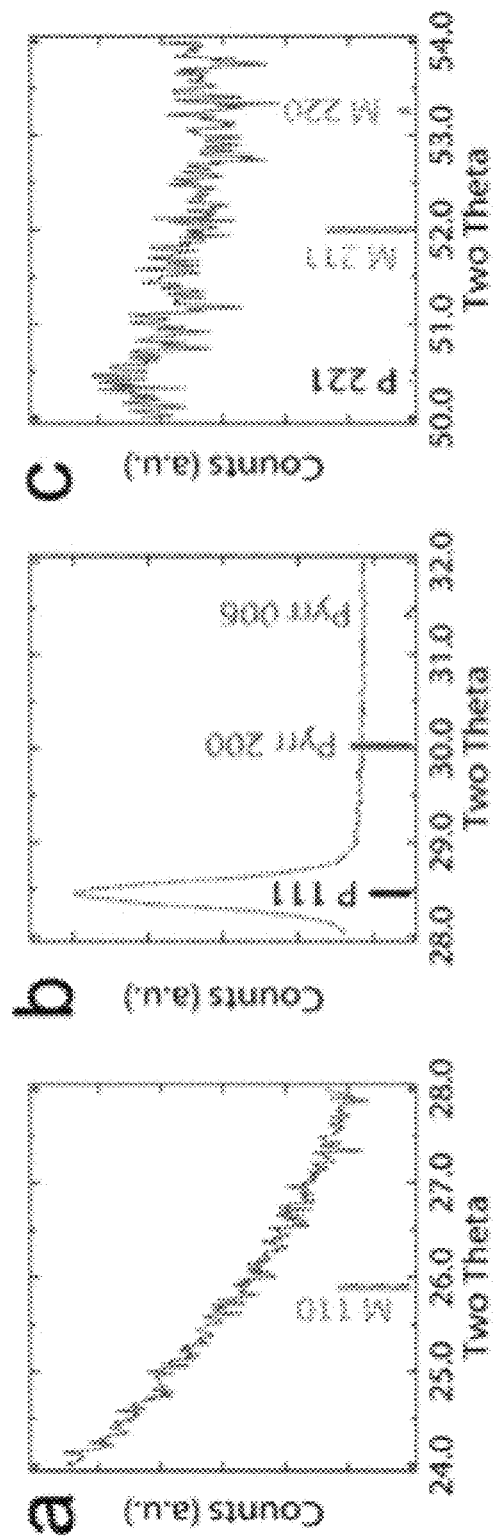

FIGS. 14A-C illustrate ultraslow conventional XRD scans of a sulfur annealed pyrite film on a quartz substrate.

Figure 15:
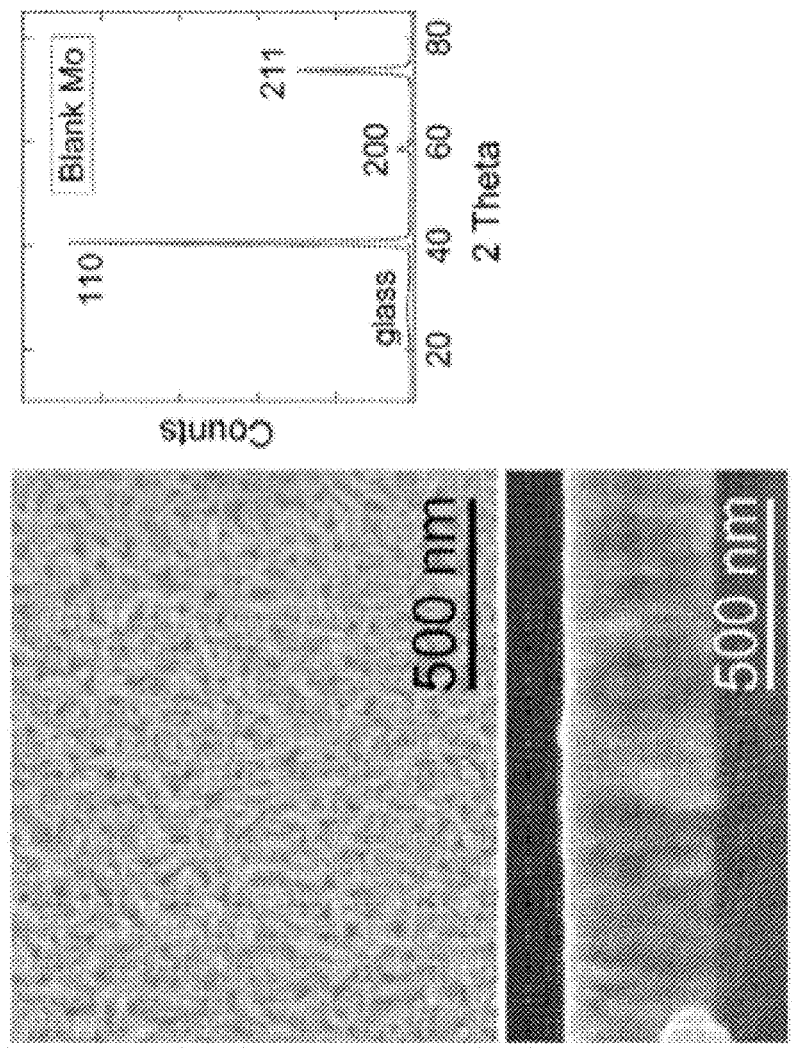

FIG. 15 illustrates SEM and XRD data for a Mo-coated glass substrate.

Figure 16:
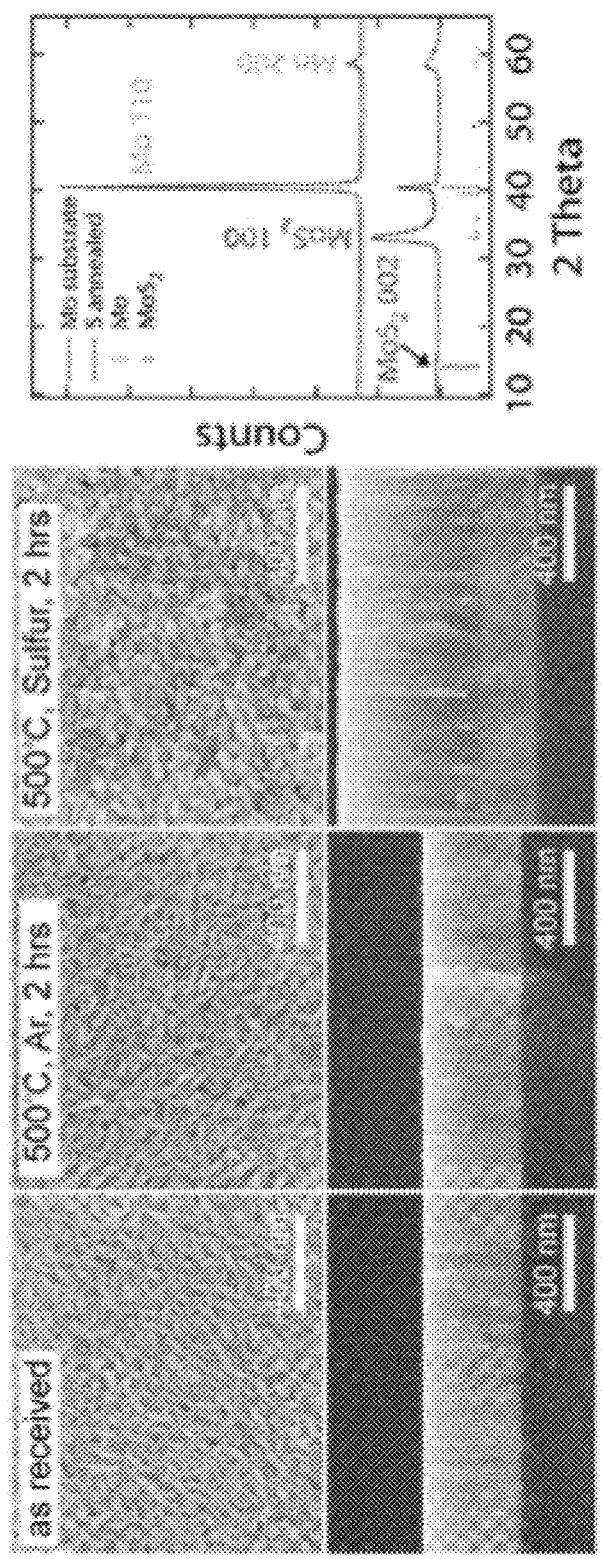

FIG. 16 illustrates exemplary characterization of Mo-coated glass substrates.

Figure 17:
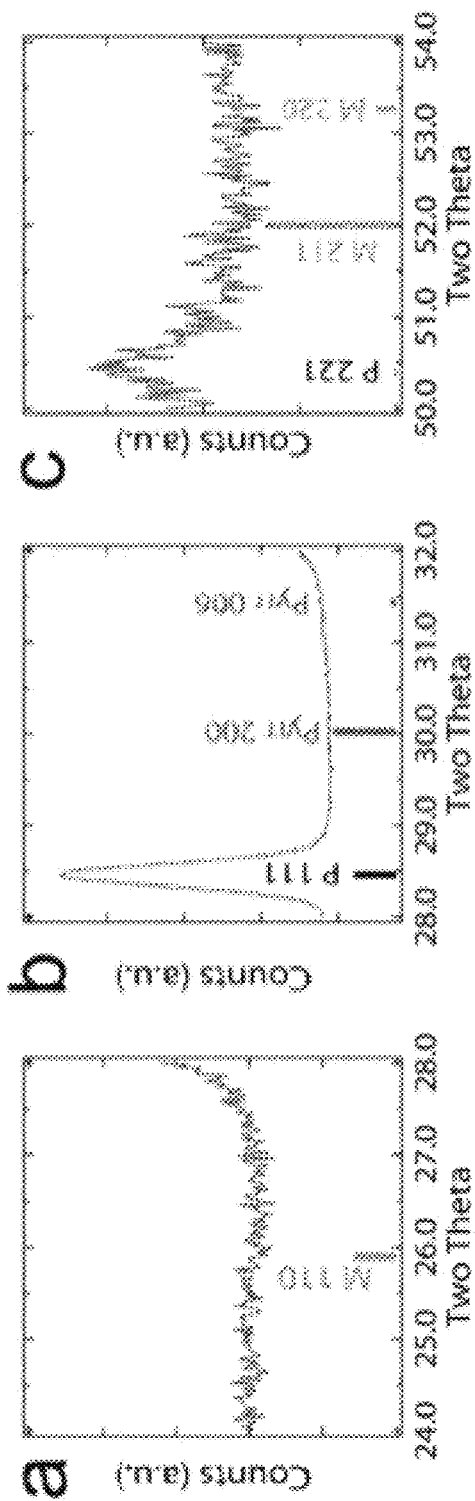

FIG. 17 illustrates ultraslow conventional XRD scans of a sulfur-annealed pyrite film on a Mo-coated glass substrate.

FIGS. 18A-B illustrate the bulk unit cell and density states of marcasite.

Figure 19:
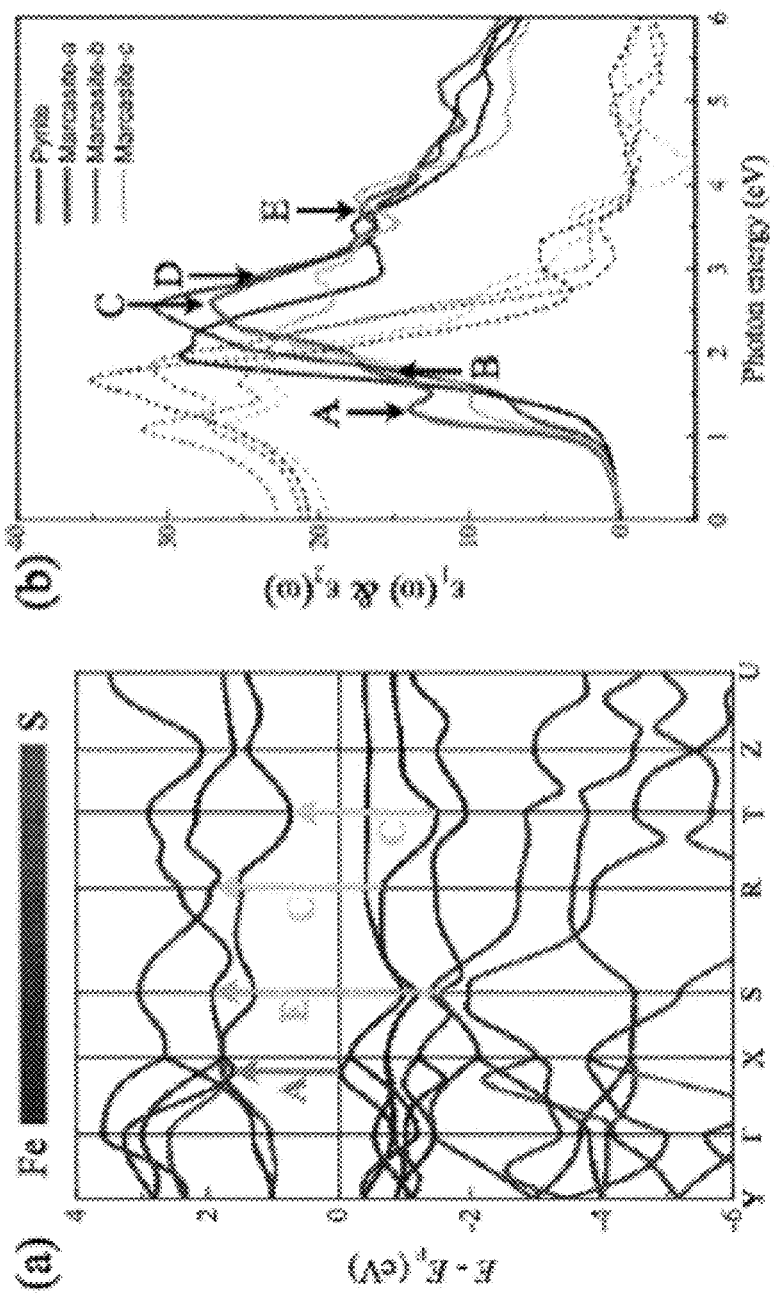

FIGS. 19A-B illustrate the band structure of and dielectric functions of marcasite.

Figure 20:
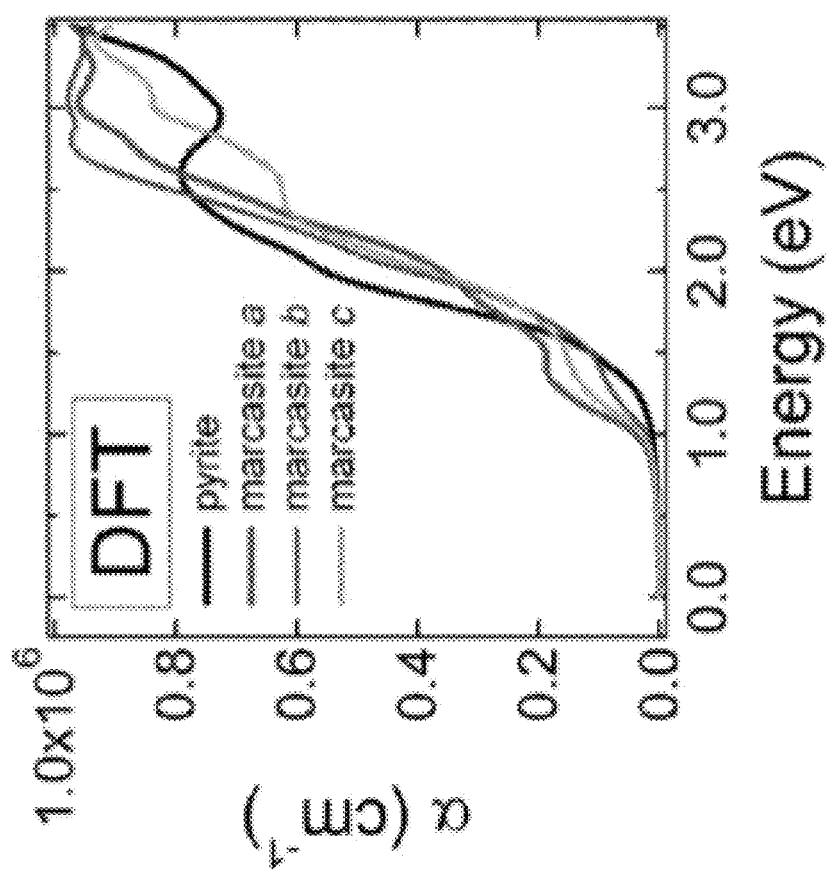

FIG. 20 illustrates the calculated absorption coefficient of marcasite and pyrite.

FIGS. 21A-B illustrate Arrhenius plots of resistivity for $FeS_2$ films made by $Fe(acac)_3$ ink, CVD, and reactive sputtering.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not necessarily describe every aspect of the teachings disclosed herein and do not limit the scope of the claims.

DETAILED DESCRIPTION

The embodiments provided herein are directed to systems and methods for fabricating pyrite thin films from molecular inks. A process is provided that comprises dissolving simple iron-bearing and sulfur-bearing molecules in an appropriate solvent and then depositing the solution onto an appropriate substrate using one of several methods (roll-to-roll coating, spraying, spin coating, etc.), resulting in a solid film consisting of the molecules. These molecular precursor films are then heated to 200-600° C. in the presence of sulfur-bearing gases (e.g., $S_2$, $H_2S$) to convert the molecular films into films of crystalline iron pyrite ($FeS_2$). This approach offers the following advantages compared to gas-phase deposition and other solution-phase approaches:

Simple and rapid deposition over large areas.
Excellent control of film composition.
Superior film uniformity.
Simple doping and alloying.
Low toxicity.
Fairly low temperature.

Figure 1:
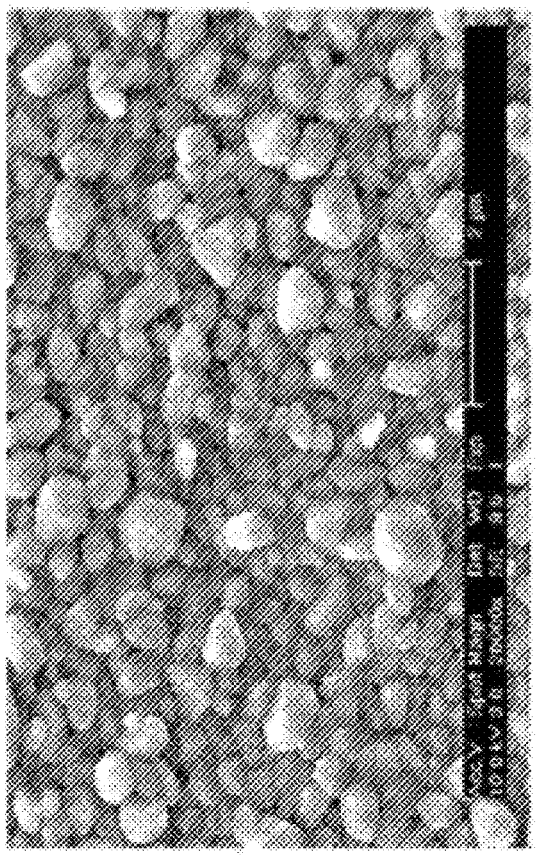
FIG. 1A illustrates X-ray diffraction pattern of a pyrite thin film produced via the DMSO/ethanolamine molecular precursor route.
FIG. 1B illustrates a scanning electron microscope image of a pyrite thin film produced via the DMSO/ethanolamine molecular precursor route.
Figure 1:
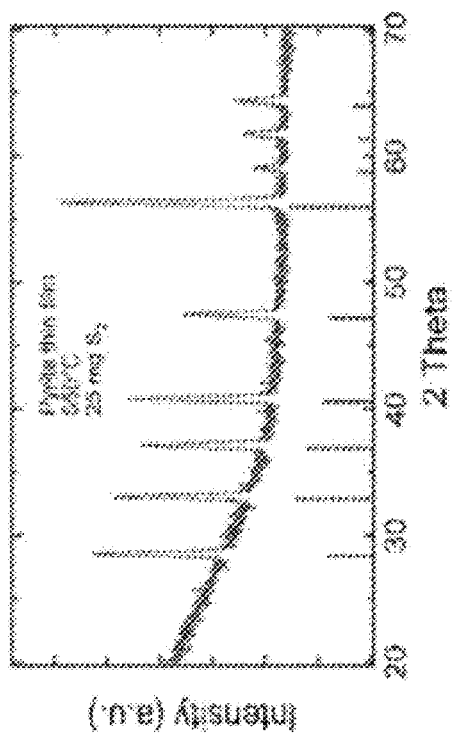

Several solution chemistries to make polycrystalline pyrite thin films have been developed. One solution is a DMSO/ethanolamine route. Sulfur and iron powders are added in a certain ratio to one part ethanolamine in 6.5 parts dimethyl sulfoxide (DMSO) and stirred for 24 hours at room temperature. This solution is then deposited by spin coating using spin conditions that yield ~150 nm thick layers for each coating cycle. After each spin coating cycle, the film is heated on a hot plate at 200° C. for 5 minutes and allowed to cool. Additional layers are spin coated as desired to achieve the desired film thickness. The film is then annealed at 400-600° C. for several hours to convert the molecular species to crystalline iron pyrite. FIG. 1A illustrates X-ray diffraction pattern of a pyrite thin film produced via the DMSO/ethanolamine molecular precursor route. FIG. 1B illustrates a scanning electron microscope image of a pyrite thin film produced via the DMSO/ethanolamine molecular precursor route.

Figure 2:
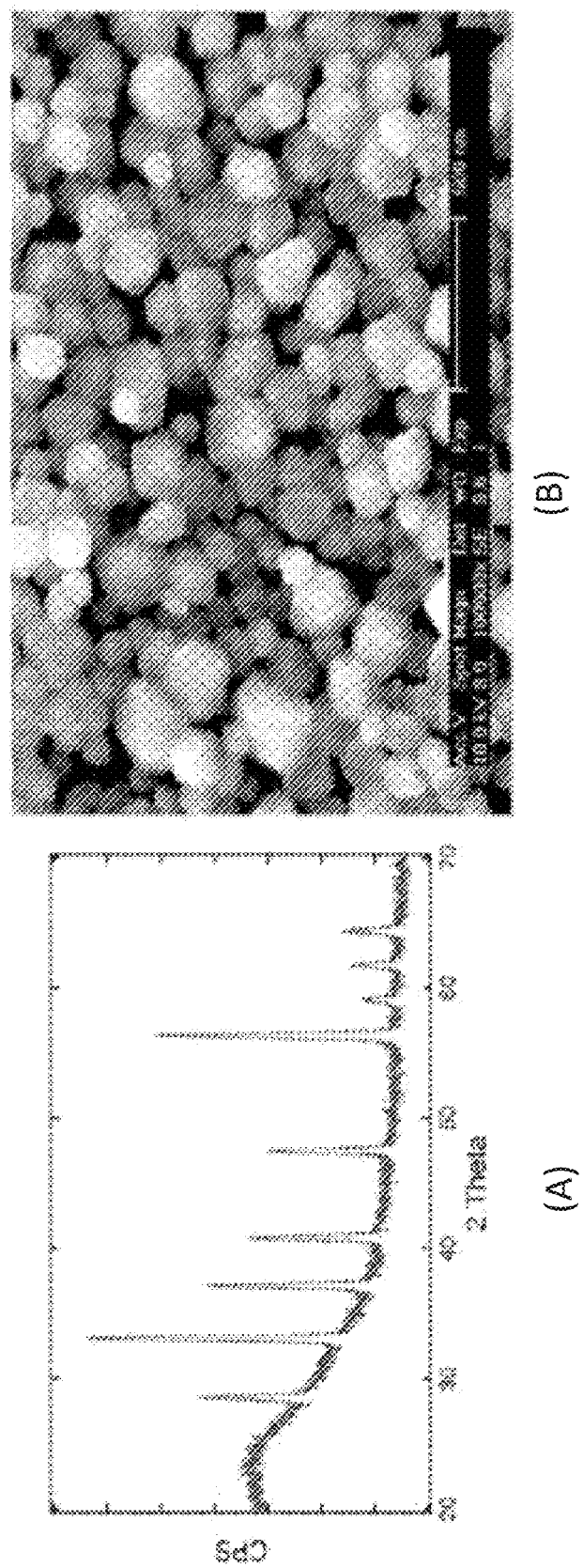
FIG. 2A illustrates X-ray diffraction pattern of a pyrite thin film produced via the pyridine route with iron (III) acetylacetonate.
FIG. 2B illustrates a scanning electron microscope image of a pyrite thin film produced via the pyridine route with iron (III) acetylacetonate.

Another solution is a pyridine route. Sulfur and iron (III) acetylacetonate are added in a certain ratio to pure pyridine. This solution is spin coated onto various substrates to make ~200 nm thick solid layers. This film is then pre-baked on a hot-plate at 350° C. for 20-30 minutes prior to being annealed in a sulfur atmosphere at 550° C. This final step converts the molecular film into a pure polycrystalline iron pyrite film coating the entire surface. FIG. 2A illustrates X-ray diffraction pattern of a pyrite thin film produced via the pyridine route with iron (III) acetylacetonate.

FIG. 2B illustrates a scanning electron microscope image of a pyrite thin film produced via the pyridine route with iron (III) acetylacetonate.

Iron pyrite (cubic $FeS_2$) is a promising candidate absorber material for earth-abundant thin-film solar cells. The present disclosure relates to phase-pure, large-grain, and uniform polycrystalline pyrite films that are fabricated by solution-phase deposition of an iron(III) acetylacetonate molecular ink followed by sequential annealing in air, H2S, and sulfur gas at temperatures up to 550° C. Phase and elemental composition of the films is characterized by conventional and synchrotron X-ray diffraction (XRD), Raman spectroscopy, Auger electron spectroscopy, secondary ion mass spectrometry (SIMS), and X-ray photoelectron spectroscopy (XPS). These solution-deposited films have more oxygen and alkalis, less carbon and hydrogen, and smaller optical band gaps ($E_g$=0.87±0.05 eV) than similar films made by chemical vapor deposition. XPS is used to assess the chemical composition of the film surface before and after exposure to air and immersion in water to remove surface contaminants. Optical measurements of films rich in marcasite (orthorhombic $FeS_2$) show that marcasite has a band gap at least as large as pyrite and that the two polymorphs share similar absorptivity spectra, in excellent agreement with density functional theory (DFT) models. Regardless of the marcasite and elemental impurity content, all films show p-type, weakly-activated transport with curved Arrhenius plots, room-temperature resistivity of ~1 Ω cm, and a hole mobility that is too small to measure by Hall effect. This universal electrical behavior strongly suggests that a single bulk or surface effect dominates charge transport in $FeS_2$ thin films.

Molecular inks are an especially promising solution-phase approach for fabricating high-performance semiconductor thin films for PVs. A molecular ink is a viscous solution of molecular precursors that is cast onto a substrate and annealed to form a film of a desired material. Pioneered by Mitzi for the synthesis of metal chalcogenides, molecular inks offer many advantages, including (i) simple and scalable processing; (ii) intermixing of precursors on a molecular level, resulting in uniform composition and excellent crystallinity in the finished film; (iii) good control of stoichiometry via ink composition; (iv) low concentrations of elemental impurities (e.g., oxygen, carbon, halides) for well-formulated, organic-free inks, such as those utilizing hydrazine (N2H4) as a solvent; (v) straightforward doping and alloying by spiking inks with desired elements; (vi) no need to synthesize, purify, assemble, and passivate nanocrystals. Hydrazine-based molecular inks have been used to fabricate CuIn (Se,S)$_2$(CISSe), CuIn$_{1-x}$Ga$_x$Se$_2$ (GIGS), and Cu$_2$ZnSnS$_4$ (CZTS) solar cells with efficiencies as high as 12.2%, 12.8%, and 11.1%, respectively, demonstrating the promise of this approach for PV applications.

The present disclosure includes discussion of the structural, optical, and electrical properties of pyrite thin films prepared from a molecular ink composed of Fe(acac)$_3$ (acac=acetylacetonate) and elemental sulfur in pyridine. This viscous, air-stable ink is spin coated onto a substrate, oxidized to form a film of iron oxides and iron salts, and then sulfurized to convert the oxides/salts to pyrite. Metal acetylacetonate inks have previously been used to make CuInS$_2$ films by roll coating.

According to one embodiment, an exemplary Fe(acac)$_3$ ink avoids the use of toxic and explosive hydrazine at the cost of relatively high levels of oxygen (1750-8800 ppm) and some carbon (500-1000 ppm) in the final films. The sulfur-annealed films are pure-phase pyrite to within the detection limit of synchrotron XRD and Raman spectroscopy. Films grown on molybdenum-coated glass substrates consist of densely-packed columnar grains and are uniform in thickness (±5%), fairly smooth (RMS roughness on the order of 10% of the film thickness), free of cracks and pinholes, and mechanically adherent and robust. Films grown on fused quartz substrates show optical band gaps of ~0.87 eV and a maximum absorption coefficient of approximately 4×10 cm$^{-1}$. The electrical properties of these films (Table 1 above) are effectively identical to nearly all other unintentionally doped pyrite films. The universal electrical behavior of pyrite films is most likely caused by a conductive, hole-rich surface layer or trace amounts of nanoscale phase impurities undetectable by XRD and other bulk analytical techniques.

According to an exemplary implementation of one embodiment of the present disclosure, iron(III) acetylacetonate (≥99.9%) and anhydrous pyridine were purchased from Aldrich, sulfur (99.995%) from Alfa Aesar, and hydrogen sulfide (99.3%) from Airgas. Electronic grade acetone (Aldrich) and HPLC grade isopropanol (Fisher) were used for cleaning substrates. All chemicals were used as received. A spin coating ink was prepared by dissolving 0.7 g of Fe(III) acetylacetonate (2 mmol) and 0.1 g of elemental sulfur (3.1 mmol) in 2 mL of pyridine and sonicating the mixture at 50° C. for 6 hours. Molybdenum-coated glass substrates were used as received, while fused quartz substrates were cleaned by sonication in acetone and isopropanol. Ink films were made by spin coating 175 µL of the solution onto clean 1 in$^2$ substrates (2000 rpm for 60 s) in a N$_2$-filled glove box. The ink layer was then placed on a cold hot plate and heated in air to 320° C. (for 1 mm thick substrates) or 370° C. (for 3 mm thick substrates) over the course of 10 minutes, after which it was immediately moved to the edge of the hot plate to cool for 5-10 seconds and placed in a cool petri dish. Two additional deposition and baking steps were used to produce films with a target pyrite thickness of ~300 nm. The ink films were then annealed in 1 atm of flowing H$_2$S gas (390° C. for 12 hours) to yield mixed-phase pyrite/marcasite thin films ("H$_2$S annealed" films). The marcasite impurity was eliminated by annealing the films in evacuated 125×14 mm quartz ampoules containing 100 mg of elemental sulfur and 100 mTorr of argon (550° C. for 8 hours).

Molybdenum-coated glass substrates were supplied by a proprietary commercial manufacturer. Molybdenum-coated silicon substrates were made by in-house RF sputtering (99.95% Mo target, 5×10$^{-6}$ Torr base pressure, 10 mTorr argon deposition pressure) onto undoped float zone silicon wafers.

For characterization of the exemplary implementation, powder X-ray diffraction data were collected with a Rigaku Ultima III diffractometer using Cu Kα radiation and a 1° incidence angle in parallel beam geometry. Quantitative phase concentrations were established by simulating powder patterns with the PDXL software package (Rigaku Corporation) using the Rietveld refinement procedure. High-resolution synchrotron XRD was carried out on beamline 11-BM of the Advanced Photon Source at Argonne National Laboratory. Scanning electron microscopy (SEM) imaging employed an FEI Quanta 3D FEG operating at 5 kV. Prior to SEM imaging, samples on quartz were coated with ~1 nm of Au/Pd using a Polaron SC 7620 sputtering system. A Renishaw inVia confocal Raman microscope with less than 5 mW of 532 nm laser excitation and a 50× objective lens was used for Raman experiments. UV-Vis optical absorption measurements were performed with a PerkinElmer Lambda 950 spectrophotometer equipped with a 60 mm integrating sphere. ~125 nm thick films were used for optical measurements. Fourier transform infrared (FTIR) spectroscopy was performed sing a Nicolet 6700 instrument in transmission mode using double-side polished silicon substrates. Temperature-dependent resistivity and Hall effect data were acquired on an Ecopia HMS 5000 system using the van der Pauw method with currents of 0.2-5.0 µA. Ohmic contacts were made by evaporating 250 nm of Ag through a shadow mask in a glovebox thermal evaporator with a base pressure of 5×10$^{-6}$ Torr. Qualitative thermopower measurements were carried out in a glovebox using a hotplate to establish an 80 K temperature gradient across the samples and a Keithley 2636 SourceMeter to determine the majority carrier type.

X-ray photoelectron spectroscopy (XPS) measurements were performed with an ES-CALAB MKII surface analysis instrument (VG Scientific). The ultrahigh vacuum multi-chamber system is equipped with a twin anode X-ray source (Mg/Al) and a 150 mm hemispherical electron energy analyzer. Spectra presented here were collected using Al Kα X-rays (1486.6 eV) in constant energy mode with a pass energy of 20 eV. The base pressure of the spectroscopy chamber was 5×10$^{-10}$ energies were calibrated by setting the Au 4f$_{7/2}$ peak of a Au foil attached to the surface of the sample to 84.0 eV. Deconvolution and spectral line fitting were carried out using Shirley backgrounds and Voigt lineshapes in the XPSPeak 4.1 software package. Samples were briefly exposed to air during loading into the XPS chamber.

Secondary ion mass spectrometry (SIMS) was performed by Evans Analytical Group on a Cameca dynamic SIMS instrument using 14.5 keV Cs ions for anions (S, O, H, C, Si) and 8 keV O2 ions for cations (Na, K, Mg, Ca, Al, Mo). Estimated detection limits were 2×10$^{15}$ atoms/cm$^3$ for Na, K, Al, and Mg, 5×10$^{15}$ atoms/cm$^3$ for Ca, 2×10$^{18}$ atoms/cm$^3$ for C, 1×10$^{19}$ atoms/cm$^3$ for O and 2×10$^{17}$ atoms/cm$^3$ for H. Atomic concentrations are accurate to within a factor of five. The depth scale was quantified by measuring the analysis craters with a stylus profilometer and confirmed by SEM imaging of the sectioned films.

Auger electron spectroscopic measurements were performed using a modified Physical Electronics Model 670 field emission scanning Auger microprobe that has been described previously. For depth profiling experiments a 5 kV, 20 nA primary electron beam was used in conjunction with a 3 kV Ar$^+$ ion beam. Samples were rotated at 1 rpm during sputtering and data acquisition. Direct spectra were numerically smoothed and differentiated using the Savitsky-Golay algorithm. Elemental intensities were corrected by literature sensitivity factors for the instrument and the atomic concentration results were normalized to 100%.

Synthesis and Structural Characterization

The ink used to prepare pyrite thin films in this exemplary implementation is a mixture of 1.0 M $Fe(acac)_3$ and 1.6 M sulfur in pyridine. Sulfur was used to increase the viscosity of the $Fe(acac)_3$ solution to enable the deposition of uniform, relatively thick layers (100-125 nm) by spin coating (discussed above).

Figure 3:
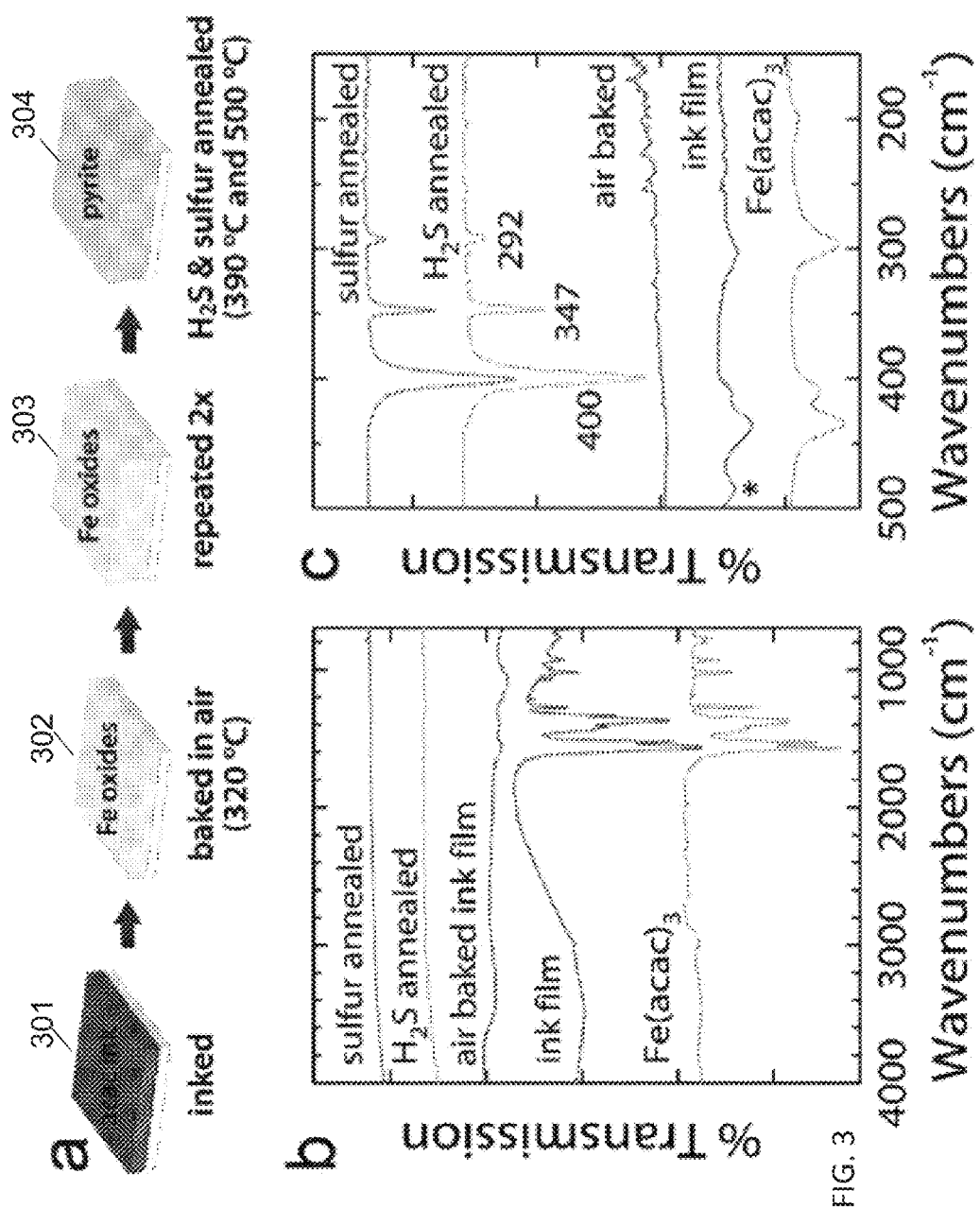
FIG. 3A illustrates an exemplary processing sequence for use with the present system, according to one embodiment.
FIG. 3B illustrates a mid-IR spectra.
FIG. 3C illustrates a far-IR spectra.

FIG. 3A illustrates an exemplary processing sequence for use with the present system, according to one embodiment. FIG. 3B illustrates a mid-IR spectra, and FIG. 3C illustrates a far-IR spectra. The processing sequence includes three cycles of ink deposition 301 and air baking 302, 303 followed by sequential annealing in $H_2S$ and then sulfur gas 304 to yield ~300 nm thick pyrite films. This film thickness was chosen because it is sufficient to absorb >95% of photons with hv>1.25 eV in one optical pass. Results yielded that both $H_2S$ and sulfur annealing are required to make high-quality pyrite films: $H_2S$ alone yields films of pyrite contaminated with marcasite (orthorhombic $FeS_2$), while direct sulfur annealing results in poor-quality, discontinuous pyrite layers. Single-layer films were characterized by FTIR spectroscopy after each processing step in order to monitor the conversion of the $Fe(acac)_3$ ink films to iron oxides/salts and subsequent sulfurization of the iron oxides/salt films to pyrite (FIGS. 3B and 3C). Prior to heating, the orange-red dried ink layer has mid-IR and far-IR spectra essentially identical to that of an $Fe(acac)_3$ standard (FIGS. 3B and 3C). The small peak at 485 $cm^{-1}$ in the ink spectrum is assigned to sulfur (labeled with an asterisk, FIG. 3C). This indicates that the dried ink is mainly a simple mixture of $Fe(acac)_3$ and sulfur. Air baking to 320° C. results in a near flatlining of the mid- and far-IR spectra (FIGS. 3B and 3C). While nonzero signal in the fingerprint region (900-1700 $cm^{-1}$) indicates the presence of organic residues in the film, it is clear that nearly all of the organics are decomposed and/or volatilized during air baking. Most of the sulfur evaporates too, and the rest is oxidized to sulfate (explained below).

As discussed in more detail below, X-ray photoelectron spectroscopy (XPS) shows that the baked films are a mixture of iron oxides, sulfates, carbonates, and perhaps hydroxides (see FIG. 8). These films are light brown in color and amorphous by X-ray diffraction (XRD). Optical absorption spectra display clear $Fe(acac)_3$ absorption peaks before air baking; after air baking, the molecular features are lost and the spectra show a monotonic absorption increase with an onset at ~1.6 eV (see FIG. 13). Annealing the baked films in $H_2S$ (1 atm, 390° C. for 12 hours) converts the iron oxides/salts to pyrite (cubic $FeS_2$), as evidenced by the appearance of characteristic pyrite IR vibrations at 292, 347, and 400 $cm^{-1}$, contaminated with a small amount of marcasite. The mid-IR spectra of $H_2S$ annealed films are completely featureless. Annealing these mixed-phase pyrite/marcasite films in sulfur vapor (~0.65 atm, 500° C. for 4 hours) converts marcasite to pyrite without causing additional changes to the IR spectra (see FIGS. 3B and 3C).

$FeS_2$ films were prepared on fused quartz substrates and molybdenum-coated soda lime glass substrates and characterized by SEM, XRD, Raman spectroscopy, and XPS. Quartz is a useful substrate for optical and electrical studies, while Mo-coated glass is a promising substrate for solar cell fabrication.

FIGS. 4A-C illustrate SEM and XRD data for a 270±30 nm thick film on quartz before and after sulfur annealing. Prior to sulfur annealing, these films consist of densely-packed but small grains of pyrite mixed with a substantial fraction of marcasite (<10 vol %, as estimated by XRD pattern analysis). XRD shows clear marcasite {110}, {120}, and {211} reflections. Sulfur annealing converts the marcasite to pyrite and results in significant grain growth, with apparent grain sizes of 50-150 nm as determined by SEM, in good agreement with the grain size determined by Scherrer analysis of synchrotron XRD patterns (100-150 nm). Pyrite is the only phase detected by XRD after sulfur annealing.

FIGS. 5A-C illustrate SEM and XRD data for a typical 270±30 nm thick $FeS_2$ film on a Mo-coated glass substrate. Prior to sulfur annealing, these films consist of densely packed, small grains of pyrite with a very small marcasite impurity evident in XRD. Sulfur annealing (in this case at 550° C. for 8 hours) eliminates the marcasite and results in tightly packed columnar pyrite grains, with most grains extending across the entire film (apparent grain size: 270 nm tall×100-250 nm wide), which is a favorable morphology for efficient charge collection in future pyrite solar cells. Sulfur annealing also converts some of the underlying Mo layer to $MoS_2$, leading in this particular film to a 3-fold volume expansion along the film normal necessary to accommodate the 3.4-fold larger $2H-MoS_2$ unit cell (106.4 $Å^3$ for $MoS_2$ vs. 31.2 $Å^3$ for Mo). The extent of Mo conversion can be controlled by tuning the sulfur annealing conditions, and phase-pure pyrite films are routinely obtained from the $Fe(acac)_3$ ink with only partial conversion of Mo to $MoS_2$. Despite the dramatic volume expansion of the Mo layer, the pyrite films are mechanically robust and strongly adherent to the substrate, easily passing the common tape peel tests. Similar results were recently reported for pyrite films grown on Mo-coated glass by chemical vapor deposition.

FIGS. 6A-C illustrate Raman spectra and high-resolution synchrotron XRD data to more rigorously assess the phase composition of the $FeS_2$ films. Raman spectroscopy is more sensitive than conventional XRD to marcasite impurities near the film surface, while synchrotron-based capillary XRD is a uniquely sensitive technique for the detection of crystalline and amorphous phase impurities. $H_2S$-annealed films on Mo-coated glass and quartz substrates show Raman bands for both marcasite (at 323 $cm^{-1}$) and pyrite (at 341, 377, and 427 $cm^{-1}$, corresponding to the $A_g$, $E_g$, and $T_g(3)$ vibrational modes, respectively). Two additional pyrite $T_g$ vibration bands are present but concealed by the large peaks at 341 and 377 $cm^{-1}$. Note that films grown on quartz contain a larger fraction of marcasite relative to pyrite because of the very low concentration of sodium and other alkalis in the quartz substrates. Sodium leaching has been observed to promote pyrite nucleation and growth at the expense of marcasite, for unknown reasons. Raman spectra of sulfur-annealed films show no sign of marcasite.

Synchrotron XRD was performed on beamline 11-BM of the Advanced Photon Source at Argonne National Laboratory in transmission mode on a sample made by loading a Kapton capillary with the powder scraped from eight sulfur-annealed films grown on glass substrates. All peaks in the pattern index to either pyrite or a-sulfur, with no other phases detected (FIG. 6C). This result shows that the presently disclosed $Fe(acac)_3$ ink approach consistently produces phase-pure pyrite films within the detection limits of state-of-the-art XRD. The trace sulfur contamination originates from occasional condensation of sulfur vapor onto the films as they cool after annealing.

FIGS. 7A-B illustrate AES and SIMS data for a 300±30 nm thick pyrite film on Mo-coated glass. FIG. 7C illustrates SIMS data for a 300±30 nm thick pyrite film on a Mo-coated silicon substrate. Auger electron spectroscopy (AES) and secondary ion mass spectrometry (SIMS) depth profiles were employed to determine the bulk elemental composition of sulfur-annealed pyrite films on Mo-coated glass and Mo-coated silicon substrates. The AES depth profile indicates that the sample can be described as $FeS_2/MoO_{0.03}S_{1.97}/MoO_xS_{2-x}$/glass stack (with x>0.03). A large amount of potassium and smaller amounts of sodium, oxygen, and carbon were detected at the surface of the film. Elevated levels of potassium and oxygen were observed at the pyrite/$MoS_2$ interface. All other elements were below AES detection limits (~0.1 at. %). The SIMS profiles in FIG. 7B show the concentration of C, H, O, Na, K, Al, Ca, and Mg as a function of depth into the film stack. Raw ion counts for three matrix elements (S, Mo, and Si) are also plotted to track position within the film stack. Average impurity concentrations in the pyrite layer are listed in Table 2 and compared to a similar film made by chemical vapor deposition (CVD). The largest impurity is oxygen (~0.9 at. %), followed by potassium (0.4%), sodium (0.14%), carbon (0.05%), hydrogen (0.034%), aluminum (0.016%), calcium (~10 ppm), and magnesium (<1 ppm), giving a total impurity load of approximately 1.5 at. %. The measurements do not reveal much about the location of these elements in the film, i.e., whether they are substitutional impurities, interstitials, defect clusters, amorphous nanoscale phase domains (e.g., a-$Fe_2O_3$), or segregated species at the surfaces and grain boundaries. In the unlikely case that the 0.9 at. % oxygen is uniformly distributed on sulfur sites ($O_s$ impurities), a stoichiometry of $FeO_{0.027}S_{1.973}$ is expected, which is in any case too light in oxygen to observe the increased band gap of iron oxysulfide alloys predicted by recent DFT calculations (see below). Note that due to the experimental conditions and the lack of SIMS standards for pyrite, it is estimated that the concentrations reported here are accurate only to within a factor of five.

Resulting oxygen levels are ~20 times higher while carbon and hydrogen levels are ~7 times lower for films made from $Fe(acac)_3$ ink rather than CVD (Table 2). These differences are caused by baking the $Fe(acac)_3$ ink layer in an oxidizing environment (air), which efficiently combusts the organics (yielding low C and H) but produces oxides (high 0). In contrast, the present CVD synthesis utilizes a reducing environment (the reaction of $Fe(acac)_3$ and tert-butyldisulfide in argon at 300° C.) that minimizes oxygen incorporation but is less effective at removing C and H from the films. Subsequent annealing of the films in H2S and sulfur (for ink-made films) or sulfur only (CVD films) is apparently unable to erase the initial differences in impurity content inherited from the first steps of film processing. Note that the concentration of alkalis (K and Na) is ~4 times higher in the ink-made films and speculate that the extended annealing times used to fabricate these films result in greater alkali diffusion from the glass.

TABLE 2

Impurity Content of Pyrite Films Made via $Fe(acac)_3$ Ink vs. CVD

| Impurity | $Fe(acac)_3$ Mo/glass (ppm) | CVD[3] Mo/glass (ppm) | $Fe(acac)_3$ Mo/Si (ppm) |
|---|---|---|---|
| oxygen | 8800 | 400 | 1750 |
| potassium | 3800 | 1000 | 50 |
| sodium | 1400 | 400 | 165 |
| carbon | 500 | 4000 | 900 |
| hydrogen | 340 | 2500 | 20-100 |
| aluminum | 160 | 100 | 165 |
| calcium | 10 | 20 | 2-6 |
| magnesium | <1 | 20 | <1 |

To determine the origin of the various impurities in the pyrite film on Mo-coated glass, the SIMS depth profile of this film is compared with data for a 300±30 nm thick film made on a Mo-coated, undoped silicon substrate (FIG. 7C). The Mo interlayer was necessary to grow high-quality, uniform pyrite films on the silicon substrates. Because the i-Si substrate is extremely pure, even by SIMS standards, it cannot be a source of any impurity other than Si itself. Indeed, the concentrations of all measured impurities fell below their SIMS detection limits after sputtering several hundred nanometers into the Si substrate (lower graph in FIG. 7C). An analysis of the S, Mo, O, and Si depth profiles suggest that this film can be described as a $FeS_2/MoO_{0.1}S_{1.9}/MoO_{0.45}S_{1.55}/MoO_x/Mo/Si$ stack. Of the elements monitored by SIMS, K and Na are present in much lower concentrations, and O and H in somewhat lower concentrations, in the pyrite film on the Mo-coated Si substrate (Table 2), while the levels of the other elements in the two films are equal within experimental error. The much lower level of alkalis in the film on Mo-coated Si indicates that leaching from glass is the principal source of alkali contamination in the pyrite layer grown on Mo-coated glass, as expected. However, K and Na are still present in substantial amounts (50 and 165 ppm) in the glass-free Si sample. Possible secondary sources of alkalis include the $Fe(acac)_3$ ink and the sputtered Mo layer. Of the three ink components, $Fe(acac)_3$ and sulfur contain very little alkalis (e.g., 2.9 ppm Na and <0.1 ppm K according to the $Fe(acac)_3$ manufacturer; and cannot be the source of the contamination. Although the purity of the pyridine solvent is unknown, the Mo layer is believed to be the main source of alkalis in the film on Mo-coated silicon. The Mo was sputtered in-house from a 99.95% Mo target with 20 ppm of Na and 30 ppm of K and could account for the measured alkalis after diffusing throughout the film during air baking and annealing. The SIMS profiles show that this Mo layer is also heavily contaminated with oxygen and carbon compared to the Mo layers on glass substrates (which were supplied by a commercial manufacturer and undoubtedly feature higher purity and density), probably due to contamination of the argon process gas by air. Morphological differences between the commercial and home-made Mo layers may result in a less dense pyrite layer on the Mo-coated silicon and explain the lower O and H content of these films. The shape of the aluminum profile shows that Al is from the Fe(acac) ink, which is consistent with the relatively high concentration of Al in the present $Fe(acac)_3$ starting material (30.5 ppm). In summary, the SIMS data show that (i) pyrite films made from $Fe(acac)_3$ ink contain relatively large amounts of oxygen (0.2-0.9%) and small amounts of carbon and hydrogen, (ii) alkalis are exogenous impurities leached from the glass substrate or molybdenum layer, and (iii) aluminum comes from the ink. Other elements are undoubtedly present in the pyrite layers at concentrations that could affect the electronic properties of these films.

FIG. 8 illustrates exemplary surface composition by XPS. XPS was used to determine the elemental composition of the surface of sulfur-annealed pyrite films on quartz and Mo-coated glass substrates as well as an air-baked ink layer on a quartz substrate. FIG. 8 shows Fe 2p, S 2p, O 1s, C 1s, K 2p, and Na 1s spectra for these three films. Spectra of pyrite films on Mo-coated glass and quartz are very similar, differing mainly in the absence of K signal from films on quartz, so the present disclosure includes only the films on Mo-coated glass.

Fe 2p spectra of the pyrite films on Mo-coated glass are dominated by pyrite peaks ($2p_{3/2}$ at 707.3 eV and $2p_{1/2}$ at 720.2 eV). Both of these peaks shows high-energy tails that are thought to be caused by slight Fe(III)-S or perhaps Fe(III)-O contamination of the surface, which has been observed even on single crystals cleaved in UHV as a result of spontaneous oxidation of Fe(II) to form surface monosulfide, $S^{2-}$.[42] Otherwise the Fe 2p spectra are clean and show no sign of additional iron species.

S 2p spectra show three sulfur species, each of which is fit as a doublet with a spin-orbit splitting of 1.2 eV: pyrite lattice persulfide ($S^{2-}_2$) with a 2 $P_{3/2}$ binding energy of 162.7 eV; polysulfides ($S^{2-}_n$), which are a mixture of molecules deposited as a residue during sulfur annealing, at 164.5 eV; and sulfates ($SO^{2-}_4$) at 168.5 eV, which are believed to be produced during brief exposure of the sample to air while loading the XPS chamber (<1 minute).

O 1s spectra show a broad peak at 532.0 eV with a shoulder at higher energy. These spectra fit well with two peaks: one at 532.0 eV, attributed to a mixture of KOH, NaOH, and sulfates, and a second at 533.6 eV, which is characteristic of adsorbed water. In general, O 1s binding energies are 529.3-530.5 eV for oxide ($O^{2-}$), 531.4-532.0 eV for hydroxide ($OH^-$), and 533-534 eV for adsorbed $H_2O$. The absence of an $O^{2-}$ peak indicates that oxides are not present on the film surface in detectable concentrations.

The C 1s spectra contain both carbon and potassium peaks. The C 1s feature is a peak with a shoulder at high energy. It is fit well by peaks at 285.1 eV (C—C and C—H) and 286.1 eV (C—O) due to the adsorption of adventitious hydrocarbons and alcohols onto the film surface. Relatively large K 2p peaks at 293.3 eV and 296.0 eV (~2:1 intensity ratio, spin-orbit splitting of 2.7 eV) indicate a substantial amount of one or more potassium compounds on the film surface, which could include potassium sulfides ($K_2S$, KS, $K_2S_3$, $KS_2$, $K_2S_5$, or $KS_3$), oxides ($K_2O$, KO, or $KO_2$), and/or hydrolysis products such as KSH, KOH, KOOH, and so on. Some sodium species are also present (Na 1s peak at ~1072.0 eV, consistent with $Na_xS_y$, NSH, NaOH, etc.). Metallic K can be ruled out, for which the K 2p peaks would appear at 294.4 eV and 297.1 eV. Metallic Na can also be ruled out based on the position of the Na $KL_{23}L_{23}$ Auger peak at 496.5 eV (metallic Na appears at 492 eV, data not shown). The presence of alkali oxides and oxyhydroxides is ruled out based on the absence of an $O^{2-}$ peak at 529.8±0.4 eV. K and Na are present as a mixture of hydroxides and various S-containing species (sulfides, hydroxysulfides, sulfates). Sulfur in $K_2S$ and $Na_2S$, found at 162.0 eV, could easily be present but would be obscured by the large persulfide peak. Oxygen in KOH, NaOH, $Na_2SO_4$ is found at 532.3±0.4 eV and accounts for the principal XP peak in the present O 1s spectra. Both of these alkali metal ions diffuse into the pyrite film from the glass substrate during annealing and segregate at the film surface as sulfides. Upon brief exposure to air, the sulfides rapidly hydrolyze to produce KOH, NaOH, and small amounts of sulfates. The absence of oxidized iron species suggests that pyrite itself is not oxidized by brief air exposure. Rather, the alkali sulfide surface contamination is rapidly hydrolyzed in air. This surface contamination may act to protect the underlying pyrite from rapid chemical attack. Note that the alkali compounds are easily removed from the surface by rinsing with water (vide infra), which may be relevant for solar cell manufacturing (for example, during CBD deposition of window layers).

Compared to the film on Mo-coated glass, the film made on quartz lacks a potassium signal at 293-296 eV and has noticeably less sulfate both in the S 2p and O 1s spectra, probably as a result of much less alkali sulfide contamination on the film surface. Surprisingly, the film on quartz shows a small Na peak at 1072.5 eV. This Na peak is not present in the baked ink, apparently because the processing conditions (320° C. for 30 minutes) are too mild for sodium to diffuse to the substrate surface. During H2S or sulfur annealing, however, sodium appears on the surface; Na is observed by XPS even on bare quartz substrates after H2S annealing. In all other ways the two sulfur-annealed films appear nearly identical in their surface composition.

FIGS. 9A-C illustrate XP spectra of a sulfur-annealed pyrite film on a Mo-coated glass substrate freshly prepared, exposed to air for 10 hours, and then rinsed and deionized in water for 10 seconds. In order to investigate the surface chemistry of the pyrite films in more detail, the film on Mo-coated glass was remeasured after exposing it to air (FIG. 9B) and again after rinsing it in water (FIG. 9C). Spectra from the fresh film are reproduced in FIG. 9A. Exposure of the pyrite film to ambient laboratory air for 10 hours results in significant changes to the data, including large increases in K, Na, O, and sulfate signal as well as the appearance of a broad oxidized iron signal centered at 710.7 eV. Based on the Fe $2p_{3/2}$ peak position and the absence of $O^{2-}$ in the oxygen spectrum, this oxidized iron species can be assigned as some combination of $Fe(OH)_3$, $FeSO_4$ (Fe $2p_{3/2}$=711.3 eV, O 1s=532.5 eV), or $FeCO_3$ (Fe $2p_{3/2}$=710.2 eV, C 1s=289.4 eV, and O 1s=531.9 eV), but probably not $Fe(OH)_2$ (Fe $2p_{3/2}$=709.5 eV) or $Fe_2(SO_4)_3$ (Fe $2p_{3/2}$=713.5 eV). The lack of an $O^{2-}$ peak at 529.8±0.4 eV indicates that oxides and oxyhydroxides such as hematite ($\alpha$-Fe2O3), goethite ($\alpha$-FeOOH), lepidocrocite ($\gamma$-FeOOH), maghemite ($\gamma$-$Fe_2O_3$), and magnetite ($Fe_3O_4$) are not formed in detectable quantities in this experiment.

The major change in the S 2p spectrum after air exposure is a significant increase in sulfate (169.1 eV) relative to persulfide and polysulfide, consistent with formation of $FeSO_4$ and accumulation of alkali sulfates. The O 1s spectrum shows a substantial increase in peak intensity, but the shape of the spectrum is largely unchanged except for the appearance of a pronounced shoulder at high energy (534.9 eV), which has yet to be assigned. The main oxygen peak centered at 532.4 eV is composed of an admixture of hydroxide, sulfate, and carbonate (at 532.0 eV) and adsorbed water (at 533.0 eV). Changes in the C 1s spectrum include the growth of the C—O signal at 286.4 eV and the appearance of carbonate ($CO^{2-}_3$) at 289.3 eV, which may represent $FeCO_3$ or alkali carbonates. The adventitious carbon peak at 284.8 eV is significantly smaller than the other carbon peaks after air exposure.

The most striking effect of air exposure is the large increase in K and Na signals. It is believed that air exposure induces the diffusion of alkali ions along grain boundaries and their accumulation at the hydrated surface of the film. Alkali ions (particularly sodium) are known to be mobile in polycrystalline chalcogenide films even at room temperature. Evidently potassium is also very mobile in the presently disclosed films. Taken together, these XPS data support a picture in which a sub-nanometer thick film of hydrated alkali and iron hydroxides, sulfates, and carbonates builds up on the pyrite surface over the first ten hours of air exposure. These species may exist as islands on the pyrite surface rather than a continuous layer.

After XPS measurement, the oxidized pyrite film was immersed in deionized water for 10 seconds, dried, and measured again. As FIG. 9C illustrates, the water rinse completely removes the K, Na, and sulfate species from the film surface, as expected for these highly soluble species. Yet the oxidized iron (710.7 eV) persists. The appearance of $O^{2-}$ (530.3 eV) and continued presence of $OH^-$ (531.4 eV) suggests that some of the oxidized iron is FeOOH. It is likely that a mixture of iron oxides (e.g., $\alpha$-$Fe_2O_3$), oxyhydroxides, and hydroxides covers the pyrite surface. Each of these iron species is quite insoluble in deionized water, so they may form either during the water rinse or in the time required to dry the film and load it into the XPS chamber. In addition, the clear presence of carbonate on the rinsed film (C 1s at 288.6 eV and O 1s at 532.4 eV) indicates that some fraction of the oxidized iron is $FeCO_3$. The origin of the broad peak at 538.4 eV in the O 1s spectrum is unclear.

Optical Properties of Pyrite Films

FIGS. 10A-C illustrate optical properties of exemplary pyrite films. The optical absorption coefficient (a) and optical band gap ($E_g$) of $FeS_2$ films on quartz substrates were determined from transmittance and reflectance measurements using an integrating sphere. Films were measured before and after sulfur annealing in order to determine the effect of the small marcasite impurity (<10 vol %) on the optical properties of the mixed-phase films. FIGS. 10A and B illustrate that $\alpha$ and $E_g$ are essentially unchanged by sulfur annealing despite full conversion of marcasite to pyrite (FIG. 10C). In both films, a reaches a value of $7 \times 10^4$ $cm^{-1}$ at hv=1.25 eV ($a^{-1}$=143 nm) and levels off at $3.4$-$3.9 \times 10^5$ $cm^{-1}$ for hv>1.75 eV ($\alpha^{-1}$<29 nm), while the band gaps fit well to allowed indirect transitions with $E_g$=0.85-0.87±0.05 eV. FIG. 10A compares the film data with recent results for a pyrite single crystal measured by spectroscopic ellipsometry and a density functional theory (DFT) model of bulk pyrite. While the shape of all four curves is similar, $\alpha$ of the films is about half as large as that of the single crystals for hv>2 eV because voids and surface roughness in the films result in an overestimation of the effective film thickness. Fully dense and flat films likely yield $\alpha$ values similar to those of the single crystals (i.e., $\alpha_{-1}$<15 nm for hv>2 eV). It is important to note that the band gap of these films is 0.1-0.15 eV smaller than the gaps measured for single crystals (FIG. 10B) or pyrite films grown by CVD (see marcasite band gap discussion below). The ink-made films also show a softer band edge (i.e., a more pronounced sub-gap absorption tail) than the CVD films (vide infra). The most likely cause of the smaller band gap and more extended sub-gap absorption tail is greater structural disorder and higher defect concentrations in the present $Fe(acac)_3$-made films, possibly as a result of producing pyrite via sulfurization of amorphous iron oxides/salts rather than "direct" synthesis of crystalline pyrite by CVD.

Optical Properties and Band Gap of Marcasite

The fact that a substantial marcasite impurity is invisible in the optical absorption spectra of the presently disclosed mixed-phase films raises renewed questions about the band gap and optical functions of marcasite. Marcasite has long been said to have a band gap of ~0.34 eV, which would make it unsuitable for solar energy conversion in bulk form and a deleterious phase impurity in pyrite. Development has recently challenged this notion by presenting rigorous density functional theory (DFT) calculations indicating that marcasite probably has a larger band gap than pyrite. The work pointed out that the purported value of the marcasite gap is based on variable-temperature resistivity data from a single natural marcasite crystal published in 1980. Fitting of resistivity data is an unreliable way to determine the band gap of a semiconductor of unknown purity and carrier mobility and should be verified with more direct techniques. The present experiments confirmed the results of Sun et al. with DFT calculations of marcasite, finding the band gaps of marcasite and pyrite to be 0.79 eV and 0.63 eV, respectively, at the generalized gradient approximation (GGA) level of theory. The present mixed-phase marcasite/pyrite thin films provide an opportunity to test these DFT predictions against experimental data.

Figure 11:
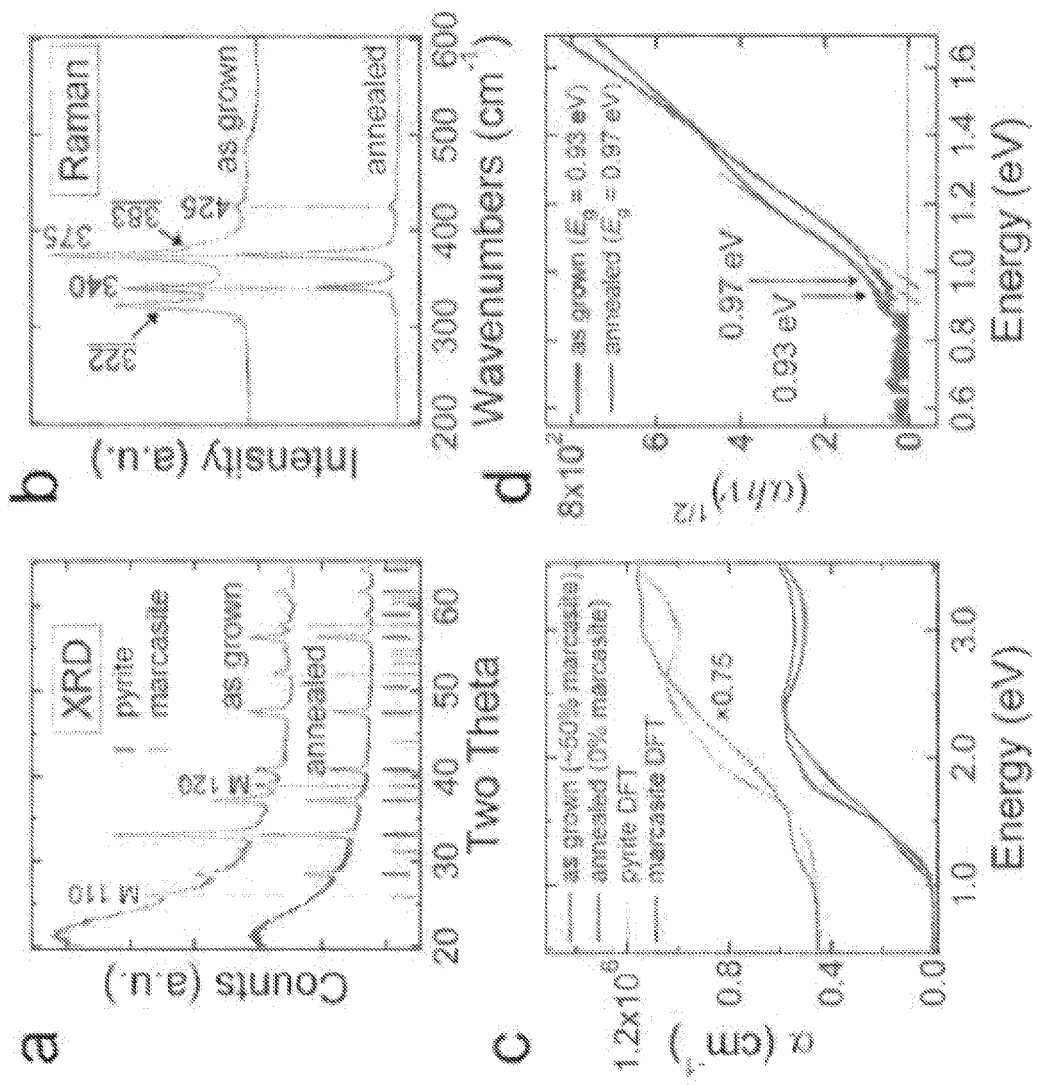

FIGS. 11A-D illustrate exemplary marcasite optical properties. Definitive measurements of the optical properties of marcasite requires the growth of thin films with significantly more marcasite content than has been possible using the present $Fe(acac)_3$ ink route. Optically-transparent $FeS_2$ films are possible that are ~50 vol % marcasite via CVD growth on sodium-free substrates such as quartz. Phase quantification was performed using XRD pattern analysis. The as-grown CVD films show large marcasite peaks in both XRD and Raman data (FIGS. 11A-B). Careful sulfur annealing of these films converts marcasite to pyrite, yielding phase-pure pyrite films while avoiding significant changes to film microstructure that would complicate spectral comparisons (FIGS. 11A-B). Optical measurements of the films before and after annealing show only subtle differences in absorptivity spectra and estimated optical band gap (FIGS. 11C-D). The main differences are: (i) mixed-phase films have a slightly smaller band gap than phase-pure pyrite films (0.93 eV versus 0.97 eV); (ii) mixed-phase films feature a small shoulder at ~1.25 eV, absent in phase-pure films; (iii) mixed-phase films have a more gradual increase in absorption coefficient; (iv) phase-pure films show a more pronounced dip in absorptivity at ~3 eV. The spectra of both types of films plateau at a ~$5.5 \times 10^5$ $cm^{-1}$ for photon energies above 2-2.25 eV. These data provide strong evidence that the optical band gap of marcasite is at least as large as that of pyrite, contrary to previous belief and in agreement with recent DFT calculations. Furthermore, the absorptivity spectra of the two polymorphs appear to be quite similar across the solar window.

These conclusions are further strengthened by the excellent agreement between experimental and computed absorptivity spectra (FIG. 11C). Calculated absorptivity spectra of pyrite and marcasite were derived from their respective optical functions as determined by DFT. Remarkably, the calculated spectra capture all of the subtle differences in the experimental data, including the shoulder at ~1.25 eV, the steeper absorption rise for pyrite, and the dip in absorptivity at ~3 eV. The calculated spectra also plateau at a similar u value for both polymorphs, in agreement with experiment (note, however, that $\alpha_{calculated}$~$8$-$9 \times 10^5$ $cm^{-1}$ but $\alpha_{experimental}$~$5.5 \times 10^5$ $cm^{-1}$, suggesting that the thin films contain voids, as mentioned above for the ink-made films). The excellent agreement between the spectra validates the accuracy of recent DFT models for both marcasite and pyrite. Results indicate that the marcasite electronic and optical band gaps are at least as large as those of pyrite. Rather than being inherently unsuitable for solar energy conversion, pure marcasite films—if they could be synthesized—may very well have better optical and electronic properties than pyrite itself. The results do not imply, however, that marcasite is necessarily a benign impurity in pyrite. Although marcasite almost certainly has a larger gap than pyrite and similar absorptivity, the existence of band edge offsets and electronic defects at the pyrite/marcasite interface as well as other types of disorder may result in degraded electronic properties for mixed-phase pyrite/marcasite thin films. Therefore the synthesis of phase-pure films—whether pyrite or marcasite—remains desirable for solar energy applications.

Electrical Properties

Figure 21:
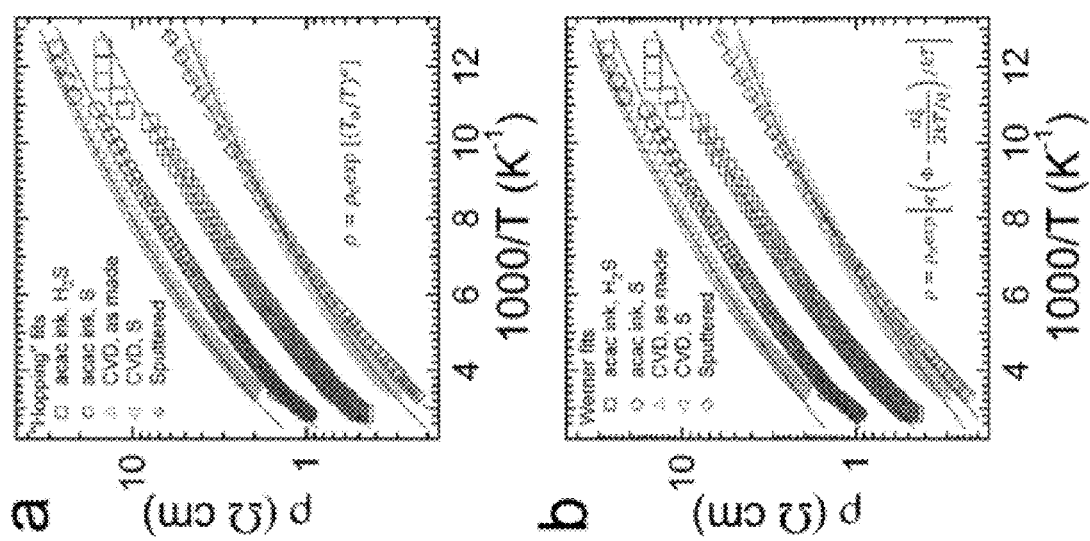

FIG. 12 illustrates exemplary electrical resistivity of pyrite and mixed-phase $FeS_2$ films. The electrical properties of $FeS_2$ films on quartz substrates were assessed by variable temperature Hall effect measurements (80-350 K) in a van der Pauw geometry with ohmic contacts made to the samples by evaporated silver pads and gold-coated copper pins. Three sulfur annealed, phase-pure pyrite films and four $H_2S$ annealed, mixed-phase films were studied. The in-plane Hall mobility of all films is too low to be measured (<1 $cm^2$ $V^{-1}$ $S^{-1}$) which also prevents determination of the carrier type from the sign of the Hall voltage. However, qualitative thermopower measurements indicate that all of the films are p-type. The dark resistivity before and after sulfur annealing is 0.65±0.10 and 1.9±0.83 Ωcm at room temperature and 15±4.5 and 38±24 Ωcm at 80 K, respectively (FIG. 12). Arrhenius plots of the resistivity are curved downwards. The resistivity of each film shows a temperature dependence of the form $\rho=\rho_0\exp[(T_0/T)^a]$ with $a\approx 0.5$ (FIG. 12). Using $a=0.5$ gives $\rho_0=0.0236$ and $0.0576$ Ωcm and $T_0=3188$ and $2899$ K for the films before and after sulfur annealing. The logarithmic derivative analysis employed by Baruth et al. yields $a=0.59$ and $0.62$ for these two films. Best fits to $\rho=\rho_0\exp[(T_0/T)^a]$ for the seven ink-made films give similar values to films grown by CVD and reactive sputtering (see FIG. 21A and Table 4). A temperature-dependent resistivity with $a\approx 0.5$ is often interpreted as evidence of Efros-Shklovskii variable range hopping (ES-VRH) transport. However, the curved Arrhenius data can be fit equally well by other models, such as the model proposed by Werner that considers transport in polycrystalline films to be limited by thermionic emission across inhomogeneous grain boundaries with a Gaussian distribution of barrier heights. Resistivity in the Werner model is given by, $$\rho = \rho_0 \exp\left[q\left(\Phi - \frac{1}{2kT/q}\sigma_\Phi^2\right)/kT\right]$$

where $\phi$ is the average barrier height and $\sigma_\phi$ is the standard deviation of the barrier height. Fits to this model yield $\phi=40$ meV and $\sigma_\phi=12$ meV for films both before and after sulfur annealing. Remarkably, $FeS_2$ films show very similar resistivity curves and fit well to either model regardless of fabrication method (ink, CVD, or sputtering) and marcasite content (FIG. 21).

The fact that nearly all unintentionally doped pyrite thin films have essentially the same electrical properties (i.e., high conductivity, low mobility, weakly-activated p-type transport characteristic of a highly doped but non-degenerate semiconductor) regardless of stoichiometry and fabrication method implies that a single robust bulk or surface effect dominates the electrical behavior of these films. Possible explanations for the universal behavior of pyrite films include the presence of (i) a ubiquitous extrinsic dopant, e.g., oxygen; (ii) nanoscale phase impurities, especially amorphous domains; (iii) surface effects, particularly a hole accumulation or inversion layer. Ongoing studies of synthetic pyrite single crystals are aiding the evaluation of these three possibilities. In stark contrast to the pyrite films, nominally-undoped pyrite single crystals are n-type, with room-temperature electron concentrations of $10^{15}$-$10^{16}$ cm$^{-3}$, mobilities of 200-400 cm$^2$ V$^{-1}$s$^{-1}$, and activation energies of ~200 meV. The following is a brief assessment of the three explanations mentioned above in light of initial comparisons between the films and single crystals:

(i) Ubiquitous dopant such as oxygen. It is possible that pyrite films show very similar electrical properties because they contain a common dopant. The identity of the alleged dopant is an open question. Native defects appear to be ruled out based on both the lack of a correlation between the iron-to-sulfur ratio and film properties as well as recent calculations showing that native defects should exist only in negligible concentration in bulk pyrite and cannot account for the large carrier densities observed in pyrite films. Non-native defects such as substitutional oxygen or interstitial hydrogen are more plausible universal dopants in pyrite. However, the present single crystals and films show similar levels of oxygen, hydrogen, and carbon via elemental analysis, yet the single crystals are n-type, not p-type, and have orders of magnitude lower carrier concentration than the films. Thus, a ubiquitous dopant such as oxygen is not responsible for the universal electrical properties of pyrite films. However, more complicated defect associations and clusters may be present in films but absent in single crystals (due to the different processing conditions) and could in principle explain the distinct behavior of these two types of pyrite samples.

(ii) Nanoscale amorphous impurities. It is probably impossible to rule out the presence of nanoscale amorphous impurities in pyrite films using XRD, Raman spectroscopy, and magnetic measurements. Such impurities may exist as a result of imperfect crystallization due to the relatively low processing temperatures and complicated carbon-containing precursors used to make the films. Single crystals show much different electrical behavior because they are made from the elements at higher temperatures and therefore lack the amorphous domains that plague the films. The absence of amorphous regions in single crystals would also explain why photoelectrochemical and Schottky solar cells based on single crystals can achieve very high external quantum efficiency, whereas films are so far not photoactive. The excellent electrical properties of the present single crystals shows that phase impurities are not inevitable in pyrite, if indeed they are present at all in properly-made pyrite films.

(iii) Hole accumulation/inversion layer. Pyrite films may be heavily hole doped and highly conductive because of a hole-rich layer that forms at the crystal surface (accumulation layer in p-type material or inversion layer in n-type material). Surface accumulation/inversion layers are well known in semiconductors such as HgCdTe and InN and, if persistent, can dominate the electrical properties of these materials. Using a combination of Hall effect and ultraviolet photoelectron spectroscopy (UPS) measurements, Bronold et al. deduced that a surface hole inversion layer is present on n-type pyrite single crystals. The hole inversion layer is believed to result from a large concentration of surface states located near the valence band edge. The present Hall effect data on single crystals are consistent with the coexistence of an n-type bulk layer and a p-type surface layer. For geometric reasons, surface effects are more severe in polycrystalline thin films than single crystals, and it is easy to envision a hole-rich surface layer controlling charge transport in pyrite films. Chemical passivation of the alleged surface states could eliminate this surface layer and enable more rational control of the electrical behavior of pyrite films for solar cells.

Figure 13:
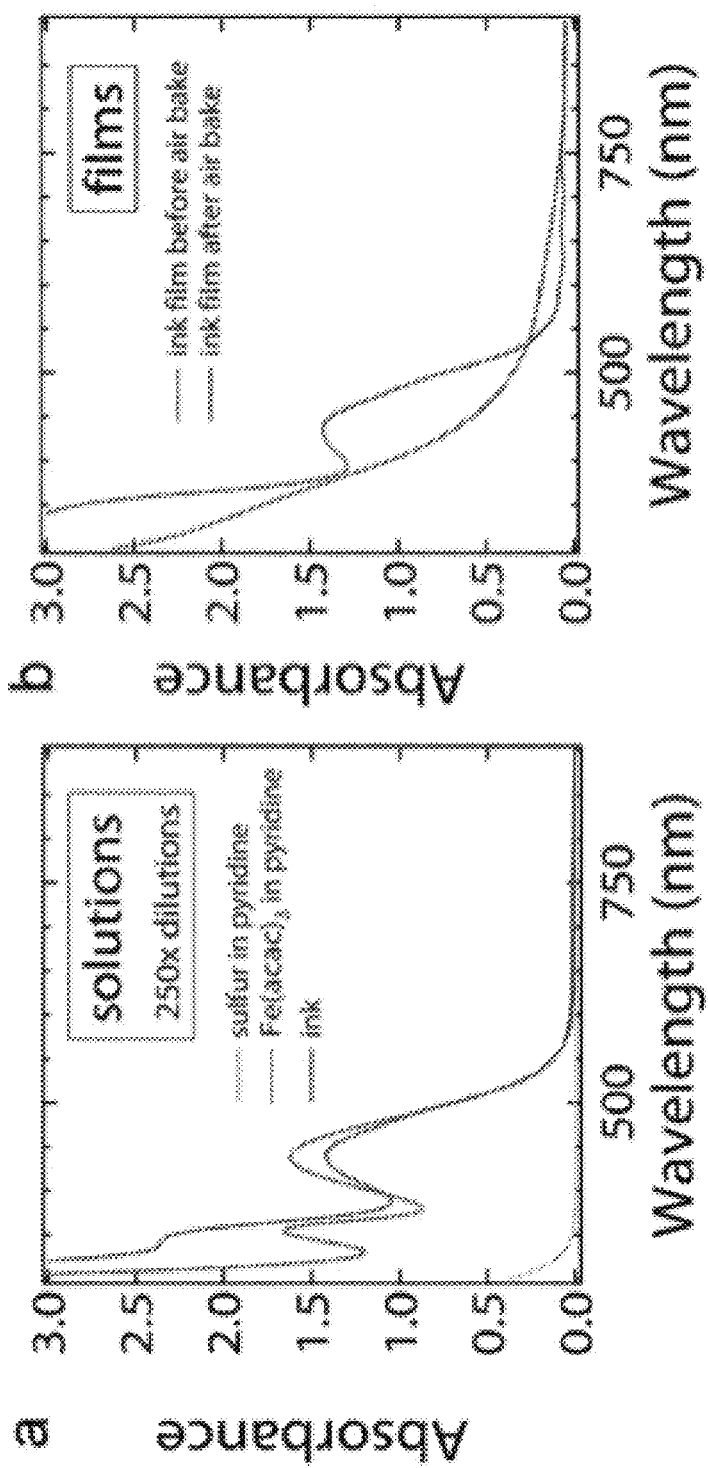

FIGS. 13A-B illustrate UV-Vis spectra of exemplary Fe(acac)$_3$ ink and films, according to one embodiment. FIG. 13 is discussed above.

FIGS. 14A-C illustrate ultraslow conventional XRD scans of a sulfur annealed pyrite film on a quartz substrate.

FIG. 15 illustrates SEM and XRD data for a Mo-coated glass substrate. FIG. 16 illustrates exemplary characterization of Mo-coated glass substrates. FIG. 17 illustrates ultraslow conventional XRD scans of a sulfur-annealed pyrite film on a Mo-coated glass substrate.

DFT Model of Marcasite

Figure 18:
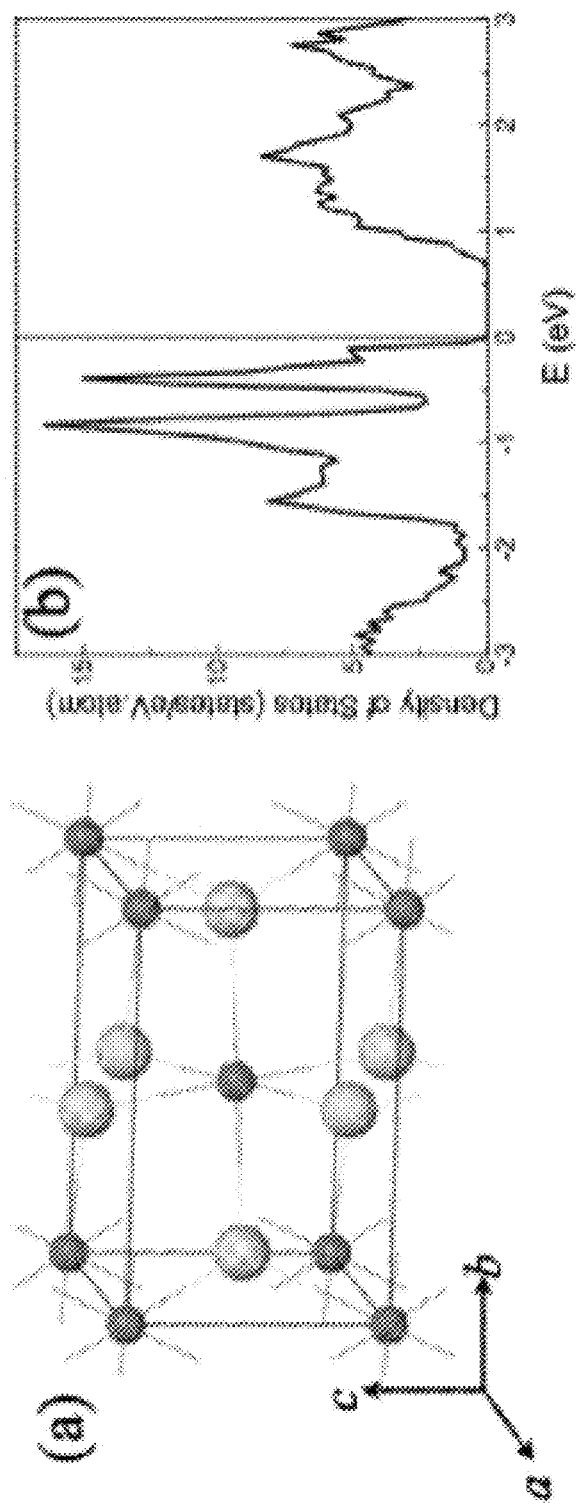

FIGS. 18A-B illustrate the bulk unit cell and density states of marcasite. FIGS. 19A-B illustrate the band structure of and dielectric functions of marcasite. Marcasite iron disulfide (FeS$_2$) has an orthorhombic Pnnm crystal structure, where the body-centered Fe atoms are surrounded by an octahedral set of S atoms, as depicted in FIG. 18. Theoretical calculations for bulk marcasite were performed using the Vienna Ab-initio Simulation Package (VASP) with the projector augmented wave (PAW) method. The generalized gradient approximation (GGA) was used to describe the exchange-correlation interaction among electrons. The present studies show that the qualitative trends of structural and electronic properties of bulk pyrite and marcasite are not much affected by the Hubbard-U correction. Furthermore, the optical features of pyrite are satisfactorily described by GGA. An energy cutoff of 350 eV was used for the plane-wave basis expansion. A 10×8×13 k-grid mesh was used to sample the Brillouin zone (BZ). All atoms were fully relaxed until the calculated force on each atom was smaller than 0.01 eV/A.

The calculated lattice constants of bulk marcasite are 4.443 A, 5.413 A, and 3.379 A, as listed in Table 3. These values agree better than 0.2% with the corresponding experimental data and are also very close to other DFT calculations. The S—S bond length in marcasite, 2.27 Å, is noticeably larger than that in pyrite, 2.16 Å. The Fe—S bond length of 2.23 Å in marcasite is slightly smaller than that in pyrite, 2.27 Å. An indirect band gap of 0.79 eV was obtained, a value that is comparable with the previous theoretical results. From the total energies of different bulk phases, it is found that marcasite is 24 meV per $FeS_2$ unit more stable than pyrite. Nevertheless, the relative stability of pyrite and marcasite may change with the use of different functionals in the calculations. For example, Sun et al. found that the ground state is marcasite in GGA and GGA+U but pyrite in the framework of the local density approximation (LDA), whereas Spagnoli et al. reported that marcasite is more stable with the LDA approach.

The density of states (DOS) of bulk marcasite is shown in FIG. 18B. The valence band of marcasite is rather broad compared to the sharp narrow valence band of bulk pyrite, which is dominated by Fe $t_{2g}$ states. DOS projections into Fe and S atoms indicate that the small peak at −0.4 eV is mostly from the Fe $d_z^2$ orbitals. Some Fe—S hybridization is obvious at the valence band maximum (VBM) near the X point of the Brillouin zone (BZ) in the band structure in FIG. 19A. Here, a color scale is used to indicate the contributions from Fe and S atoms. In contrast to the dominant contribution from the S-pp$\sigma$* orbital of pyrite, the conduction band minimum (CBM) of marcasite at the T point originates almost completely from the Fe d-orbitals. The calculated electron effective mass of marcasite is 1.11-1.36$m_e$ (depending on crystal direction, where $m_e$ is the rest mass of a free electron) at the CBM, and the effective hole mass is about 0.4 $m_e$. The electron and hole effective mass for pyrite at the GGA level of theory are 0.45 $m_e$ and 2.75-3.56 $m_e$, respectively.

TABLE 3

Calculated Lattice Constants of Bulk Marcasite

| | a (Å) | b (Å) | c (Å) | $E_g$ (eV) |
|---|---|---|---|---|
| This Work[a] | 4.4430 | 5.4130 | 3.3792 | 0.79 |
| Ref. 7 | 4.4382 | 5.4094 | 3.3884 | 0.81 |
| Exp.[a] | 4.443 | 5.425 | 3.387 | 0.34 |
| Pyrite[c] | 5.418 | — | — | 0.63 |

Notes:
[a]Band gap based on calculated lattice constants. $E_g$ = 0.78 eV if experimental lattice constants are used.
[b]Band gap determined by fitting resistivity vs. T data.
[c]Band gap based on experimental lattice constant. $E_g$ = 0.4 eV if calculated lattice constant (5.403 Å) is used.

FIG. 19B shows the calculated dielectric functions of bulk marcasite in three different crystal directions, together with results for pyrite. As reported previously, DFT calculations reproduce well the main features in the real and imaginary parts of the dielectric function of pyrite, indicating the appropriateness of the present approach and parameters for the determination of optical properties of iron disulfide compounds. For marcasite, the three principal axes are different and hence the dielectric matrix has three distinct diagonal elements. The main features of the dielectric functions along the three axes are rather similar (FIG. 19B). Using the $\in_2(\omega)$ curve along a axis as an example, it is interesting to see that a pronounced peak develops right above 1.0 eV, about 0.4 eV below the optical absorption threshold of pyrite. Note that the Hubbard-U correction was omitted for both marcasite and pyrite and the band gap of pyrite is even slightly smaller, 0.63 eV. Therefore, marcasite is predicted to be a stronger absorber in the red and infrared regions of the spectrum. The second main absorption peak of marcasite shifts to 2.6 eV, about 0.5 eV above the main absorption peak of pyrite. From both band structure and optical functions, the presence of marcasite grains in pyrite samples should improve light absorption.

The examination then turned to tracing the origins of main critical points (CPs) of the $\in_2(\omega)$ curve (indicated with arrows in FIG. 19A). This is done by conducing k- and energy-resolved analyses with momentum matrix elements, $|\dot{P}_{mn}|^2$, throughout the BZ. Here, m and n are band indices, and only dipole transitions were considered. It was found that the main contribution to CP "A" is the transition near the VBM, as indicated in FIG. 19A, with both initial and final states the hybridized Fe-$d_{xz,yz}$ and S-$p_z$ states. The major CP structure centered at 2.6 eV (denoted as "C") can be attributed to the transition near the R and T points in the BZ, as highlighted in FIG. 19A. More explicitly, it results from transitions (i) from the occupied Fe-$d_{yz}$ states to a mixture of Fe-d and S-p orbitals at the R point, and (ii) from the Fe-$t_{2g}$ states to Fe-$d_{xz}$ states at the CBM at the T point. For the CP structure "E" at 3.7 eV, as marked by the green arrow in FIG. S9a, the major contribution is from transitions between the mixtures of F-$e_g$/S-$p_z$ states and Fe-$d_{xz,yz}$/S-$p_z$ states. Two relatively weak peaks "B" and "D" were also identified in the present DFT calculations, at ~1.9 eV and ~3.1 eV, respectively.

FIG. 20 illustrates the calculated absorption coefficient of marcasite and pyrite. The absorption coefficient ($\alpha$) of both marcasite and pyrite was calculated from the respective optical functions as determined by DFT. The absorptivity spectra are plotted in FIG. 20.

FIGS. 21A-B illustrate Arrhenius plots of resistivity for $FeS_2$ films made by Fe(acac)$_3$ ink, CVD, and reactive sputtering.

TABLE 4

Fit Parameters For Data in FIGS. 21A-B

| Sample | $\rho_0$ (hopping) | $T_0$(hopping) | a (hopping) | $\rho_0$(Werner) | $\Phi$ (Werner) | $\sigma_\Phi$ (Werner) |
|---|---|---|---|---|---|---|
| Ink, H$_2$S | 0.050 ± 0.022 | 1780 ± 830 | 0.57 ± 0.05 | 0.153 | 0.0405 | 0.0117 |
| Ink, S | 0.094 ± 0.010 | 1860 ± 370 | 0.56 ± 0.01 | 0.314 | 0.0406 | 0.0123 |
| CVD, as made | 0.0118 | 4130 | 0.451 | 0.0851 | 0.0376 | 0.012 |
| CVD, S | 0.105 | 2770 | 0.49 | 0.537 | 0.0383 | 0.012 |
| Sputtered | 0.0088 | 3070 | 0.512 | 0.0579 | 0.041 | 0.0114 |

Iron pyrite thin films synthesized from an Fe(acac)$_3$ ink have been disclosed. Phase-pure, polycrystalline iron pyrite thin films have been fabricated by solution phase deposition of an Fe(acac)$_3$/sulfur ink followed by sequential annealing in air, H$_2$S, and sulfur gas at temperatures ranging from 320° C. to 550° C. FTIR and XPS data show that the acetylacetonate ink layer is first converted to a mixture of iron oxides, hydroxides, sulfates, and carbonates by air annealing and then sulfurized to form pyrite. The sulfur-annealed films are pure-phase pyrite to within the detection limit of synchrotron XRD and Raman spectroscopy. Films on Mo-coated glass substrates consist of densely-packed columnar grains and are uniform in thickness (±5%), fairly smooth (RMS roughness on the order of 10% of the film thickness), free of cracks and pinholes, and mechanically adherent and robust. These films can be described as FeS$_2$/MoO$_{0.03}$S$_{1.97}$/MoO$_x$S$_{2-x}$/glass stacks (with x>0.03). SIMS shows that the total impurity load in the pyrite layers of these films is ~1.5 at %, with a ~20-fold larger concentration of oxygen but ~7-fold smaller amounts of carbon and hydrogen than similar films produced by CVD. Detailed XPS data show that (i) potassium and sodium accumulate on the film surface, (ii) air exposure results in the slow buildup of a layer of hydrated alkali and iron hydroxides, sulfates, and carbonates, and (iii) rinsing the oxidized films in water completely removes the alkali and sulfate contaminants but not the insoluble oxidized iron species. Films grown on quartz substrates have an indirect optical band gap of 0.87±0.05 eV, which is 0.1-0.15 eV smaller than that of CVD and single crystal samples, perhaps reflecting greater structural disorder or higher defect concentrations in the solution-deposited films. Optical measurements of marcasite-rich samples indicate that marcasite has a band gap at least as large as that of pyrite and that the two polymorphs share similar absorptivity spectra, in excellent agreement with DFT results. The in-plane electrical properties of these films are qualitatively identical to nearly all other unintentionally-doped FeS$_2$ samples in the literature: regardless of the marcasite content and impurity load, the films show p-type, weakly-activated transport with a curved Arrhenius plot, a room-temperature resistivity of ~1 Ωcm, and a hole mobility that is too small to measure by the Hall effect. This universal electrical behavior strongly suggests that a common bulk or surface effect dominates transport in FeS$_2$ thin films. Three possible explanations have been outlined herein for this universal behavior, i.e., a common dopant, nanoscale phase impurities, or a hole accumulation/inversion layer.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

Iron pyrite thin films from molecular inks have been disclosed. It is understood that the embodiments described herein are for the purpose of elucidation and should not be considered limiting the subject matter of the disclosure. Various modifications, uses, substitutions, combinations, improvements, methods of productions without departing from the scope or spirit of the present invention would be evident to a person skilled in the art.

What is claimed is:

1. A method for producing pyrite thin films, comprising the steps of
    creating a solution of molecular species comprising iron-bearing and sulfur-bearing molecules;
    depositing a thin film of the solution onto a substrate; and
    annealing the thin film to convert the molecular species to crystalline iron pyrite, wherein the step of annealing is conducted in an environment containing a sulfur based gas;
    wherein the step of creating a solution comprises the steps of adding sulfur and iron powders in a predetermined ratio to one part ethanolamine in 6.5 parts dimethyl sulfoxide (DMSO), and stirring the sulfur, iron powders, and DMSO as a solution for 24 hours at room temperature.

2. The method of claim 1 wherein the step of depositing a thin film includes one of roll-to-roll coating, spraying, and spin coating.

3. The method of claim 1 wherein the sulfur based gas is one of S$_2$ and H$_2$S.

4. The method of claim 2 wherein the step of spin coating comprises using spin conditions that yield a thin film having an ~150 nm thick layer.

5. The method of claim 4 further comprising step of heating the thin film.

6. The method of claim 5 further comprising step of cooling the thin film.

7. The method of claim 6 wherein the thin film has a plurality of layers spin coated to achieve a desired film thickness.

8. A method for producing pyrite thin films, comprising the steps of
    creating a solution of molecular species comprising iron-bearing and sulfur-bearing molecules;
    depositing a thin film of the solution onto a substrate; and
    annealing the thin film to convert the molecular species to crystalline iron pyrite
    wherein the step of annealing includes annealing the thin film in a sulfur atmosphere;
    wherein the step of annealing converts the molecular film into a pure polycrystalline iron pyrite film and
    wherein the step of creating a solution comprises adding sulfur and iron (Ill) acetylacetonate in a predetermined ratio of pyridine to form the solution.

9. The method of claim 8 further comprising the step of spin coating the solution onto various substrates to make individual solid layers.

10. The method of claim 9 wherein the individual solid layers are ~200 nm thick.

11. The method of claim 8 further comprising step of pre-baking the thin film prior to annealing the thin film.

12. The method of claim 8 wherein the step of depositing a thin film includes one of roll-to-roll coating, spraying, and spin coating.

13. The method of claim 8 wherein the step of annealing includes annealing the thin film at temperatures in a range of about 200-600° C. for a plurality of hours to convert the molecular species to crystalline iron pyrite.

14. The method of claim 8 wherein the sulfur based gas is one of S$_2$ and H$_2$S.

15. The method of claim 12 wherein the step of spin coating comprises using spin conditions that yield a thin film having an ~150 nm thick layer.

16. The method of claim 15 further comprising step of heating the thin film.

17. The method of claim 16 further comprising step of cooling the thin film.

18. The method of claim 17 wherein the thin film has a plurality of layers spin coated to achieve a desired film thickness.

19. The method of claim 1 further comprising step of pre-baking the thin film prior to annealing the thin film.

* * * * *